(12) United States Patent
Kanamori et al.

(10) Patent No.: US 10,998,301 B2
(45) Date of Patent: May 4, 2021

(54) SEMICONDUCTOR DEVICE

(71) Applicant: Samsung Electronics Co., Ltd., Suwon-si (KR)

(72) Inventors: Kohji Kanamori, Seongnam-si (KR); Hyun Mog Park, Seoul (KR); Yong Seok Kim, Suwon-si (KR); Kyung Hwan Lee, Hwaseong-si (KR); Jun Hee Lim, Seoul (KR); Jee Hoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 16/531,778

(22) Filed: Aug. 5, 2019

(65) Prior Publication Data
US 2020/0203329 A1    Jun. 25, 2020

(30) Foreign Application Priority Data
Dec. 21, 2018    (KR) ........................ 10-2018-0167170

(51) Int. Cl.
*H01L 25/18*    (2006.01)
*H01L 23/00*    (2006.01)
(Continued)

(52) U.S. Cl.
CPC .............. *H01L 25/18* (2013.01); *H01L 24/05* (2013.01); *H01L 24/08* (2013.01); *H01L 24/09* (2013.01);
(Continued)

(58) Field of Classification Search
CPC ......... H01L 25/18; H01L 24/08; H01L 24/09; H01L 24/05; H01L 27/11556;
(Continued)

(56) References Cited

U.S. PATENT DOCUMENTS 6,746,911 B2    6/2004    Han
8,476,708 B2    7/2013    Fukuzumi et al.
(Continued)

FOREIGN PATENT DOCUMENTS

JP    2011-204829 A    10/2011

*Primary Examiner* — Thanhha S Pham
(74) *Attorney, Agent, or Firm* — Harness, Dickey & Pierce, P.L.C.

(57) ABSTRACT

A semiconductor device includes a first semiconductor structure including circuit devices and first bonding pads; and a second semiconductor structure connected to the first semiconductor structure, the second semiconductor structure including a base layer; a first memory cell structure including first gate electrodes and first channels penetrating through the first gate electrodes; a second memory cell structure including second gate electrodes and second channels penetrating through the second gate electrodes; bit lines between the first and the second memory cell structures, and electrically connected to the first and second channels in common; first and second conductive layers on the second surface of the base layer; a pad insulating layer having an opening exposing a portion of the second conductive layer; and second bonding pads disposed to correspond to the first bonding pads in a lower portion of the second memory cell structure.

20 Claims, 21 Drawing Sheets

(51) Int. Cl.
*H01L 27/11556* (2017.01)
*H01L 27/11582* (2017.01)

(52) U.S. Cl.
CPC .. *H01L 27/11556* (2013.01); *H01L 27/11582* (2013.01); *H01L 2224/022* (2013.01); *H01L 2224/05025* (2013.01); *H01L 2224/08145* (2013.01); *H01L 2224/0903* (2013.01); *H01L 2224/09181* (2013.01); *H01L 2924/14511* (2013.01)

(58) Field of Classification Search
CPC ....... H01L 27/11582; H01L 2224/0903; H01L 2224/08145; H01L 2924/14511; H01L 2224/05025; H01L 2224/09181; H01L 2224/022; H01L 27/0688; H01L 27/11575; H01L 27/11573; H01L 27/11521; H01L 27/11514; H01L 27/11551; H01L 27/11578; H01L 27/11597
See application file for complete search history.

(56) References Cited

U.S. PATENT DOCUMENTS

| | | |
|---|---|---|
| 8,513,731 B2 | 8/2013 | Lee et al. |
| 9,502,471 B1 | 11/2016 | Lu et al. |
| 9,876,031 B1 | 1/2018 | Shimizu et al. |
| 2011/0220987 A1 | 9/2011 | Tanaka et al. |
| 2016/0079164 A1 | 3/2016 | Fukuzumi et al. |
| 2017/0271581 A1 | 9/2017 | Seong et al. |
| 2018/0012937 A1 | 1/2018 | Park et al. |
| 2018/0277497 A1* | 9/2018 | Matsuo ................... H01L 25/18 |

* cited by examiner

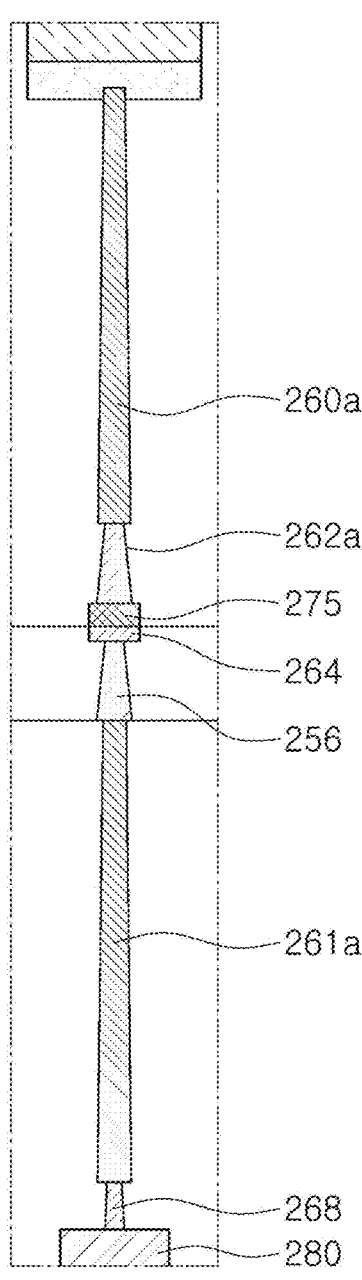
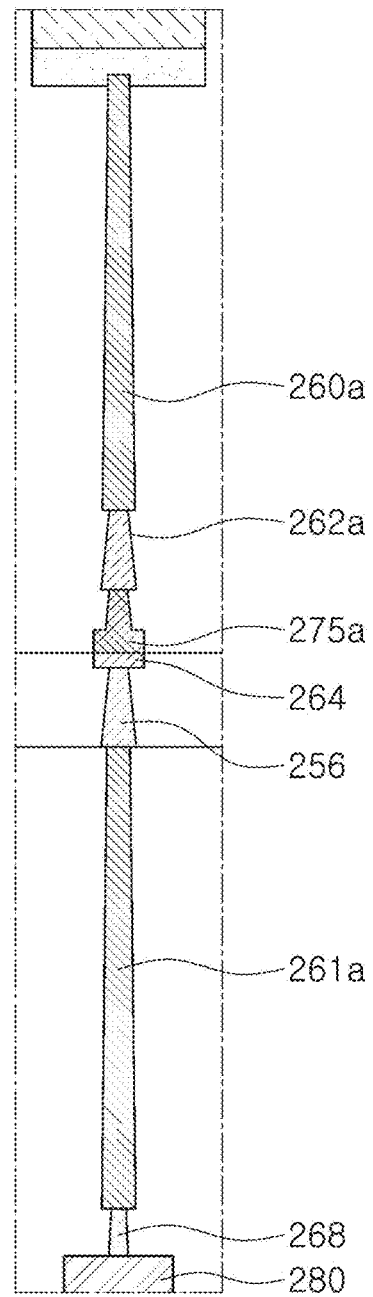
FIG. 5A
FIG. 5B

SEMICONDUCTOR DEVICE

CROSS-REFERENCE TO RELATED APPLICATION(S)

This application claims priority to Korean Patent Application No. 10-2018-0167170 filed on Dec. 21, 2018 in the Korean Intellectual Property Office, the disclosure of which is herein incorporated by reference in its entirety.

BACKGROUND

1. Field

Example embodiments of the present inventive concepts relate to a semiconductor device.

2. Description of Related Art

Semiconductor devices have consistently been reduced in size and designed to process high capacity data. Accordingly, it has been necessary to increase integration density of a semiconductor structure included in a semiconductor device. To improve integration density, a semiconductor device having a vertical transistor structure instead of a planar transistor structure has been developed.

SUMMARY

Example embodiments of the present inventive concepts provide a semiconductor device having improved integration density and reliability.

According to some example embodiments of the present inventive concepts, a semiconductor device includes a first semiconductor structure including a substrate, circuit devices disposed on the substrate, and first bonding pads disposed on the circuit devices; and a second semiconductor structure connected to the first semiconductor structure on the first semiconductor structure, the second semiconductor structure including, a base layer having a first surface facing the first semiconductor structure and a second surface opposing the first surface; a first memory cell structure including first gate electrodes spaced apart from each other and stacked in a direction perpendicular to the first surface of the base layer on the first surface, and first channels penetrating through at least portions of the first gate electrodes; a second memory cell structure including second gate electrodes spaced apart from each other and stacked in a direction perpendicular to the first surface in lower portions of the first gate electrodes, and second channels penetrating through at least portions of the second gate electrodes; bit lines disposed between the first memory cell structure and the second memory cell structure, and electrically connected to the first and second channels in common; first and second conductive layers spaced apart from each other and disposed on the second surface of the base layer; a pad insulating layer disposed on the first and second conductive layers and having an opening exposing a portion of the second conductive layer; and second bonding pads disposed to correspond to the first bonding pads in a lower portion of the second memory cell structure.

According to some example embodiments of the present inventive concepts, a semiconductor device includes a first semiconductor structure including a substrate, circuit devices disposed on the substrate, and first bonding pads disposed on the circuit devices; and a second semiconductor structure connected to the first semiconductor structure on the first semiconductor structure, the second semiconductor structure including, a base layer; memory cell structures stacked in a direction perpendicular to a lower surface of the base layer on the lower surface; at least one wiring line disposed between the memory cell structures and shared between the memory cell structures disposed upwardly and downwardly; first and second conductive layers spaced apart from each other and disposed on an upper surface of the base layer; a pad insulating layer disposed on the first and second conductive layers and having an opening exposing a portion of the second conductive layer; a connection pad disposed in parallel to the at least one wiring line in a lower portion of the second conductive layer and electrically connected to the second conductive layer; and second bonding pads disposed to correspond to the first bonding pads in lower portions of the memory cell structures.

According to some example embodiments of the present inventive concepts, a semiconductor device includes a first semiconductor structure including a substrate, circuit devices disposed on the substrate, and first bonding pads disposed on the circuit devices; and a second semiconductor structure connected to the first semiconductor structure on the first semiconductor structure, the second semiconductor structure including, a base layer; memory cell structures stacked in a direction perpendicular to a lower surface of the base layer on the lower surface, and including gate electrodes stacked vertically; at least one wiring line disposed between the memory cell structures and shared between the memory cell structures disposed upwardly and downwardly; a first conductive layer disposed on the base layer in upper portions of the gate electrodes; a second conductive layer spaced apart from the first conductive layer in a horizontal direction and provided for electrical connection with an external device; a pad insulating layer disposed on the first and second conductive layers and having an opening exposing a portion of the second conductive layer; a connection pad disposed in parallel to the at least one wiring line in a lower portion of the second conductive layer and electrically connected to the second conductive layer; and second bonding pads disposed to correspond to the first bonding pads in lower portions of the memory cell structures.

BRIEF DESCRIPTION OF DRAWINGS

The above and other aspects, features, and advantages of some example embodiments of the present inventive concepts will be more clearly understood from the following detailed description, taken in conjunction with the accompanying drawings, in which:

FIGS. 5A and 5B are schematic cross-sectional diagrams illustrating partial elements of a semiconductor device according to some example embodiments of the present inventive concepts;

DETAILED DESCRIPTION

Hereinafter, some example embodiments of the present inventive concepts will be described as follows with reference to the accompanied drawings.

In the descriptions below, terms "upper," "upper portion," "upper surface," "lower," "lower portion," "lower surface," "side surface," and the like, are used with reference to the diagrams unless otherwise indicated.

Figure 1:
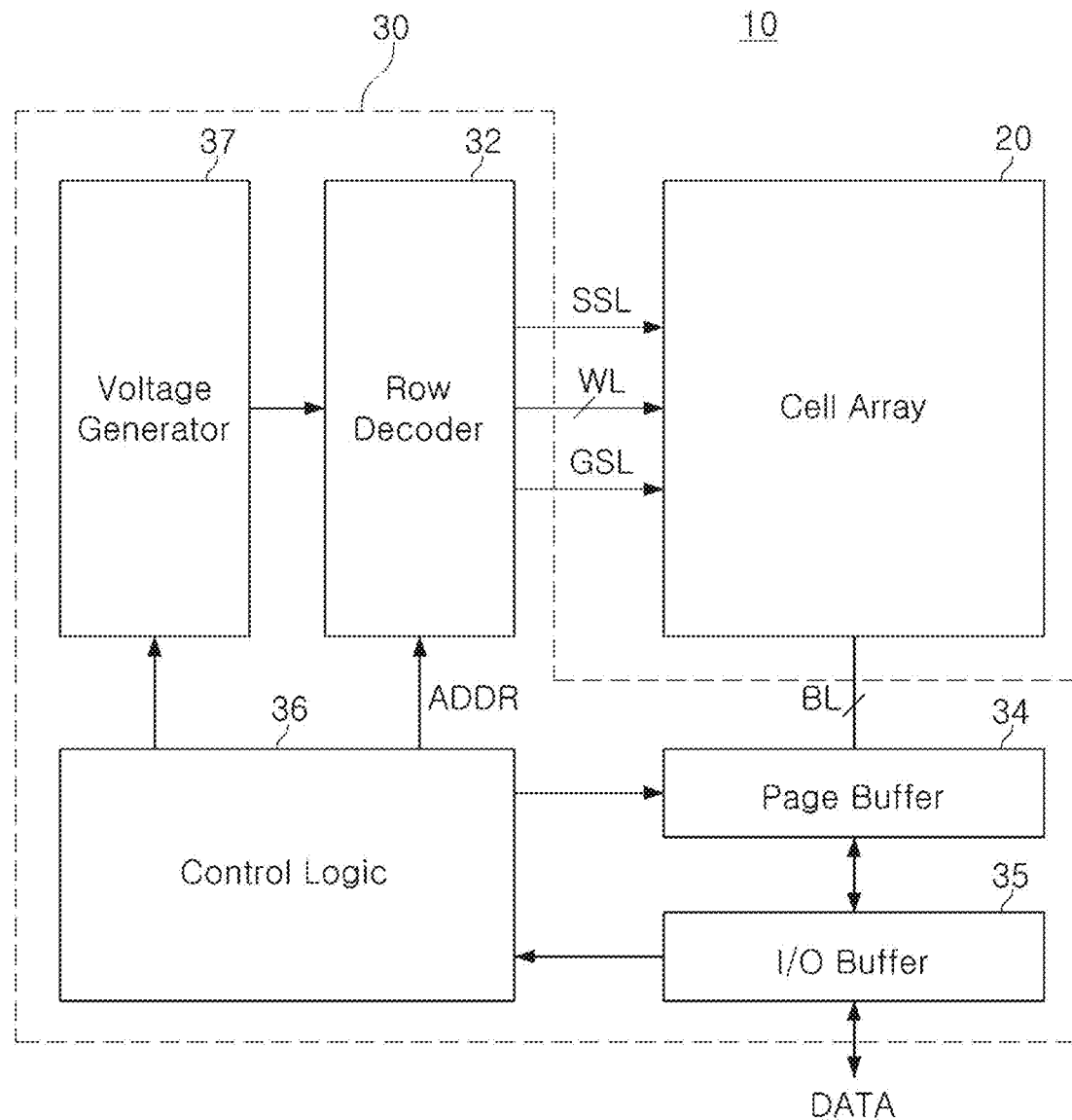
FIG. 1 is a schematic block diagram illustrating a semiconductor device according to some example embodiments of the present inventive concepts.

FIG. 1 is a schematic block diagram illustrating a semiconductor device according to some example embodiments.

Referring to FIG. 1, a semiconductor device 10 may include a memory cell array 20 and a peripheral circuit 30. The peripheral circuit 30 may include a row decoder 32, a page buffer 34, an input and output buffer 35, a control logic 36, and a voltage generator 37.

The memory cell array 20 may include a plurality of memory blocks, and the memory blocks each may include a plurality of memory cells. The plurality of memory cells may be connected to the row decoder 32 through a string select line SSL, word lines WL, and a ground select line GSL, and may be connected to the page buffer 34 through bit lines BL. In some example embodiments, a plurality of memory cells arranged in the same row may be connected to the same word line WL, and a plurality of memory cells arranged in the same column may be connected to the same bit line BL.

The row decoder 32 may decode an input address ADDR and may generate and transfer driving signals of the word line WL. The row decoder 32 may provide a word line voltage generated from the voltage generator 37 to a selected word line WL and non-selected word lines WL in response to control of the control logic 36.

The page buffer 34 may be connected to the memory cell array 20 through the bit lines BL, and may read information stored in the memory cells. The page buffer 34 may temporarily store data to be stored in the memory cells and/or may sense data stored in the memory cells in accordance with an operational mode. The page buffer 34 may include a column decoder and a sense amplifier. The column decoder may selectively activate the bit lines BL of the memory cell array 20, and the sense amplifier may sense voltage of a bit line BL selected by the column decoder and/or may read data stored in a selected memory cell during a reading operation.

The input and output buffer 35 may receive data DATA and may transfer the data to the page buffer 34 when a program operates, and in a reading operation, the input and output buffer 35 may output the data DATA received from the page buffer 34 to an external entity (not shown). The input and output buffer 35 may transfer an input address and/or an input command to the control logic 36.

The control logic 36 may control operations of the row decoder 32 and the page buffer 34. The control logic 36 may receive a control signal and an external voltage transferred from an external entity (not shown), and may operate in accordance with the received control signal. The control logic 36 may control a reading operation, a writing operation, and/or an erasing operation in response to the control signals.

The voltage generator 37 may generate voltages required for internal operations, such as a program voltage, a reading operation voltage, an erasing operation voltage, and the like, for example, using an external voltage. The voltages generated in the voltage generator 37 may be transferred to the memory cell array 20 through the row decoder 32.

Figure 2:
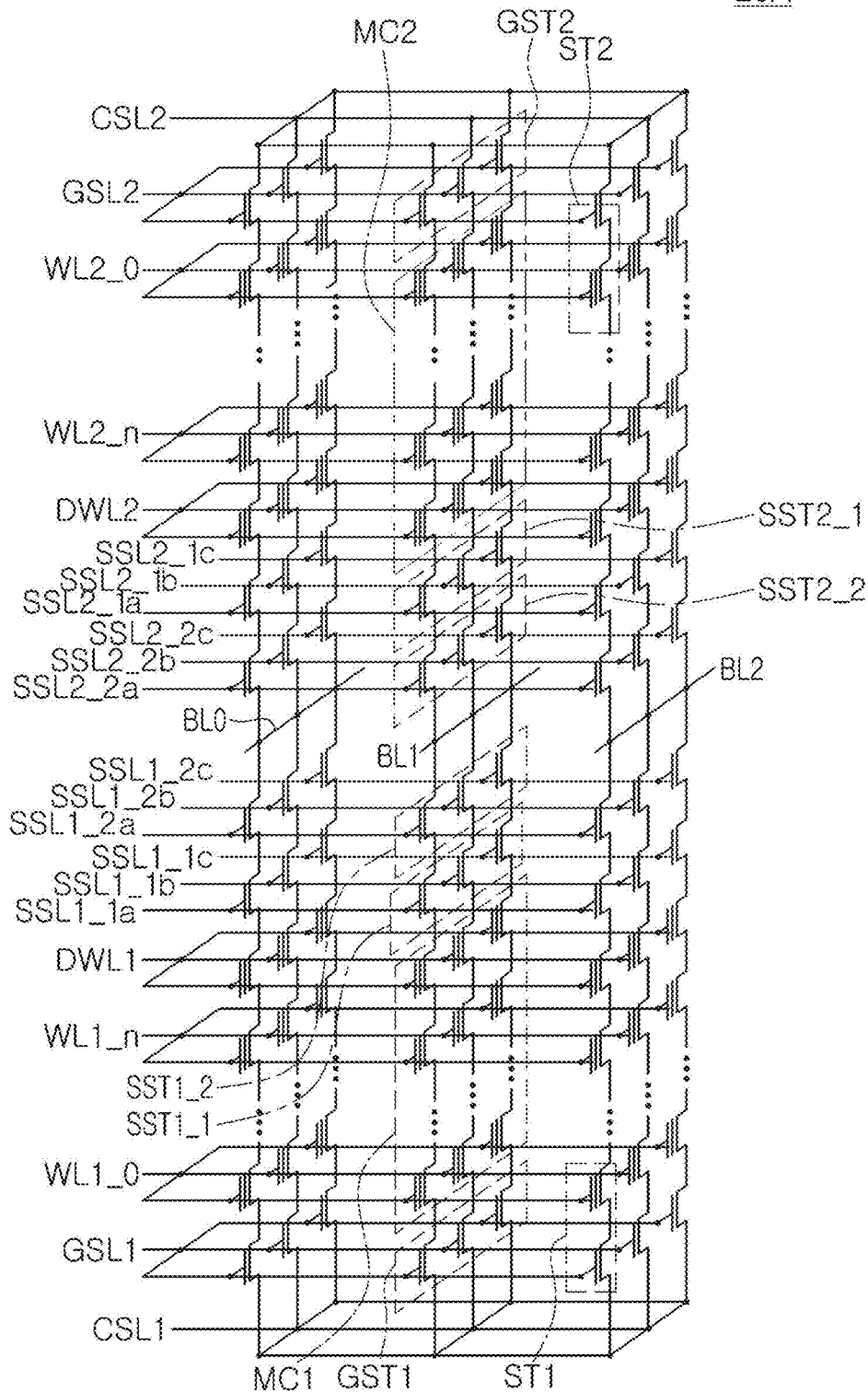
FIG. 2 is an equivalent circuit diagram of a cell array of a semiconductor device according to some example embodiments of the present inventive concepts.

FIG. 2 is an equivalent circuit diagram of a cell array of a semiconductor device according to some example embodiments.

Referring to FIG. 2, a memory cell array 20A may include a plurality of first memory cell strings ST1 including first memory cells MC1 connected to each other in series, a first ground select transistor GST1 connected to first ends of the first memory cells MC1, and first string select transistors SST1_1 and SST1_2 connected to second ends of the first memory cells MC1 and each other in series. The plurality of first memory cell strings ST1 may be connected to respective common bit lines BL0 to BL2 in parallel. The plurality of first memory cell strings ST1 may be connected to a first common source line CSL1 in common. In other words, the plurality of first memory cell strings ST1 may be disposed between the plurality of common bit lines BL0 to BL2 and a single first common source line CSL1. In some example embodiments, a plurality of first common source lines CSL1 may be disposed two-dimensionally.

The memory cell array 20A may include a plurality of second memory cell strings ST2 including second memory cells MC2 disposed in upper portions of the common bit lines BL0 to BL2 and connected to each other in series, a second ground select transistor GST2 connected to first ends of the second memory cells MC2, and second string select transistors SST2_1 and SST2_2 connected to second ends of the second memory cells MC2 and each other in series. The plurality of second memory cell strings ST2 may be connected to respective common bit lines BL0 to BL2 in parallel. The plurality of second memory cell strings ST2 may be connected to a second common source line CSL2 in common. In other words, the plurality of second memory cell strings ST2 may be disposed between the plurality of common bit lines BL0 to BL2 and a single second common source line CSL2. In some example embodiments, a plurality of second common source lines CSL2 may be disposed two-dimensionally.

The common bit lines BL0 to BL2 may be disposed in a central portion of the memory cell array 20A and may be electrically connected to the first and second memory cell strings ST1 and ST2 disposed upwardly and downwardly. The first and second memory cell strings ST1 and ST2 may have substantially the same circuit structure with reference to the common bit lines BL0 to BL2. In the description below, common aspects of the first and second memory cell strings ST1 and ST2 will be described without distinguishing the first and second memory cell strings ST1 and ST2 from each other.

The memory cells MC1 and MC2 connected to each other in series may be controlled by words lines WL1_0-WL1_$n$ and WL2_0-WL2_$n$ for selecting the memory cells MC1 and MC2. The memory cells MC1 and MC2 each may include a data storage element. Gate electrodes of the memory cells MC1 and MC2 disposed in substantially the same distance from the common source lines CSL1 and CSL2 may be connected to one of the words lines WL1_0-WL1_$n$ and WL2_0-WL2_$n$ in common and may be in an equipotential state. Alternatively, even when the gate electrodes of the memory cells MC1 and MC2 are disposed in substantially the same distance from the common source lines CSL1 and CSL2, the gate electrodes disposed in different rows or columns may be controlled independently.

The ground select transistors GST1 and GST2 may be controlled by the ground select lines GSL1 and GSL2, and may be connected to the common source lines CSL1 and CSL2. The string select transistors SST1_1, SST1_2, SST2_1, and SST2_2 may be controlled by the string select lines SSL1_1a, SSL1_1b, SSL1_1c, SSL1_2a, SSL1_2b, SSL1_2c, SSL2_1a, SSL2_1b, SSL2_1c, and SSL2_2a, SSL2_2b, SSL2_2c, and may be connected to the common bit lines BL0 to BL2. FIG. 2 illustrates an example in which one ground select transistor GST1 and GST2 and two string select transistors SST1_1, SST1_2, SST2_1, and SST2_2 may be respectively connected to the plurality of memory cells MC1 and MC2 connected to each other in series, but some other example embodiments thereof are not limited thereto. For example, a single string select transistor and/or a plurality of ground select transistors may be connected to the plurality of memory cells MC1 and MC2. One or more dummy word lines DWL1 and DWL2 or a buffer line may also be disposed between uppermost word lines WL1_$n$ and WL2_$n$ among the words lines WL1_0-WL1_$n$ and WL2_0-WL2_$n$ and the string select lines SSL1_1a, SSL1_1b, SSL1_1c, SSL1_2a, SSL1_2b, SSL1_2c, SSL2_1a, SSL2_1b, SSL2_1c, and SSL2_2a, SSL2_2b, SSL2_2c. In some example embodiments, one or more dummy word lines may also be disposed between lowermost word lines WL1_0 and WL2_0 and the ground select lines GSL1 and GSL2. In some example embodiments, the term "dummy" may refer to an element having a structure and a shape the same as or similar to structures and shapes of other elements, but which may not substantially function in the device.

When a signal is applied to the string select transistors SST1_1, SST1_2, SST2_1, and SST2_2 through the string select lines SSL1_1a, SSL1_1b, SSL1_1c, SSL1_2a, SSL1_2b, SSL1_2c, SSL2_1a, SSL2_1b, SSL2_1c, and SSL2_2a, SSL2_2b, SSL2_2c, a signal applied through the common bit lines BL0 to BL2 may be transferred to the memory cells MC1 and MC2 connected to each other in series, and operations of reading and/or writing data may be performed accordingly. Also, as a certain level of erase voltage is applied through a substrate, an operation of erasing data recorded in the memory cells MC1 and MC2 may be performed. In some example embodiments, the memory cell array 20A may further include at least one dummy memory cell string electrically isolated from the common bit lines BL0 to BL2.

Figure 3:
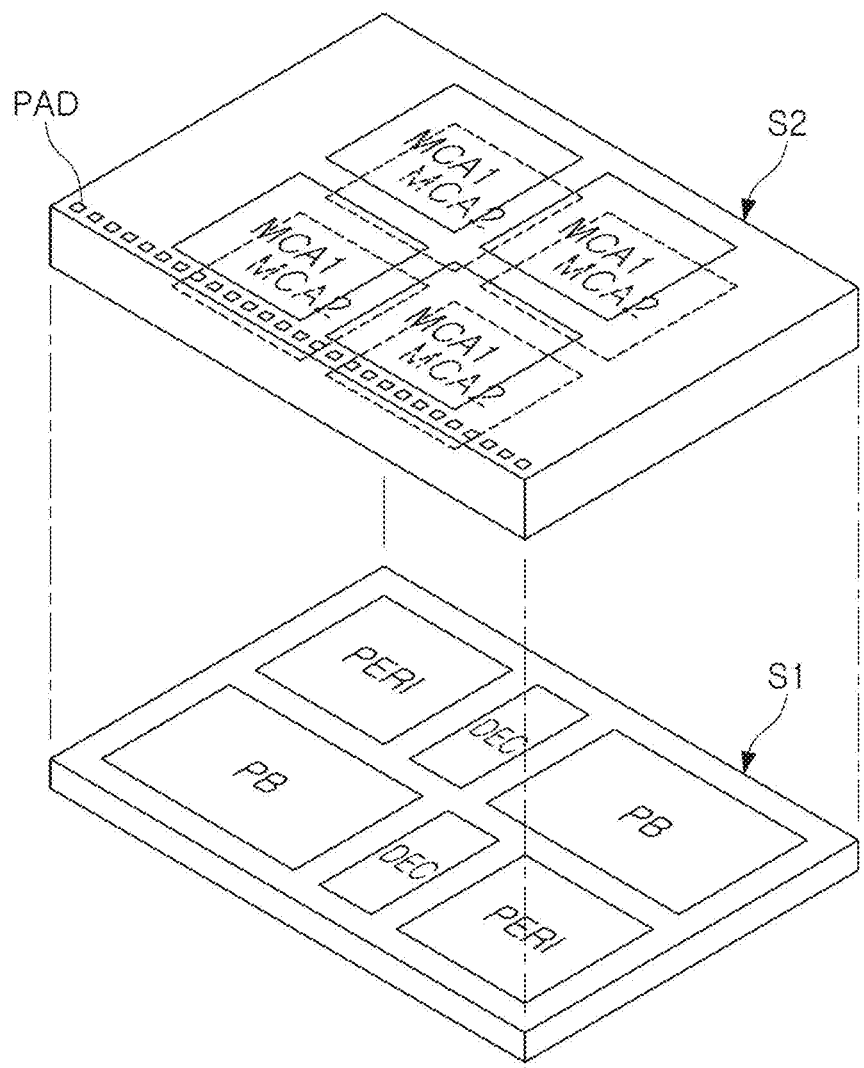
FIG. 3 is a schematic diagram illustrating a layout of an arrangement of a semiconductor device according to some example embodiments of the present inventive concepts.

FIG. 3 is a schematic diagram illustrating a layout of an arrangement of a semiconductor device according to some example embodiments.

Referring to FIG. 3, a semiconductor device 10A may include first and second semiconductor structures S1 and S2 stacked in a vertical direction. The first semiconductor structure S1 may be included in the peripheral circuit 30 illustrated in FIG. 1, and the second semiconductor structure S2 may be included in the memory cell array 20 illustrated in FIG. 1.

The first semiconductor structure S1 may include row decoders DEC, page buffers PB, and other peripheral circuits PERI. The row decoders DEC may refer to the row decoder 32 described with reference to FIG. 1, and the page buffers PB may refer to a region of the page buffer 34. The other peripheral circuits PERI may be a region including the control logic 36 and the voltage generator 37 illustrated in FIG. 1, and may include a latch circuit, a cache circuit, and/or a sense amplifier, for example. The other peripheral circuits PERI may also include the input and output buffer 35 illustrated in FIG. 1, and may include an electrostatic discharge (ESD) device and/or a data input and output circuit. In some example embodiments, the input and output buffer 35 may be disposed to form a separate region in a circumference of the other peripheral circuits PERI.

At least a portion of the various circuit regions DEC, PB, and PERI in the first semiconductor structure S1 described above may be disposed in lower portions of memory cell arrays MCA1 and MCA2 of the second semiconductor structure S2. For example, the page buffer PB and the other peripheral circuits PERI may be disposed to overlap the memory cell arrays MCA1 and MCA2 in lower portions of the memory cell arrays MCA1 and MCA2. In some other example embodiments, however, the circuits included in the first semiconductor structure S1 and the arrangement form of the circuits may vary, and the circuits overlapping the memory cell arrays MCA1 and MCA2 may also vary in various manners. Also, in some example embodiments, the circuit regions DEC, PB, and PERI may have forms in which the arrangement form illustrated in FIG. 3 is repeatedly and consecutively disposed depending on the number and sizes of the memory cell arrays MCA1 and MCA2.

The second semiconductor structure S2 may include memory cell arrays MCA1 and MCA2 and pad regions PAD. The memory cell arrays MCA1 and MCA2 may include first and second memory cell arrays MCA1 and MCA2 stacked vertically, and each of the first and second memory cell arrays MCA1 and MCA2 may be spaced apart from each other and disposed on the same plane. In some other example embodiments, however, the number, the number of layers, and/or an arrangement form of the memory cell arrays MCA1 and MCA2 disposed in the second semiconductor structure S2 may vary. The pad regions PAD may be disposed on at least one side of the memory cell arrays MCA1 and MCA2, and may be disposed along at least one edge of the second semiconductor structure S2 while forming columns. Alternatively, the pad regions PAD may be disposed between the first and second memory cell arrays MCA1 and MCA2 while forming columns. The pad regions PAD may be configured to transmit an electrical signal to and/or to receive an electrical signal from an external device. In the semiconductor device 10A, the pad regions PAD may be regions electrically connected to an input and output circuit, the input and output buffer 35 illustrated in FIG. 1, among the circuits provided in the other peripheral circuits PERI of the first semiconductor structure S1.

Figure 4:
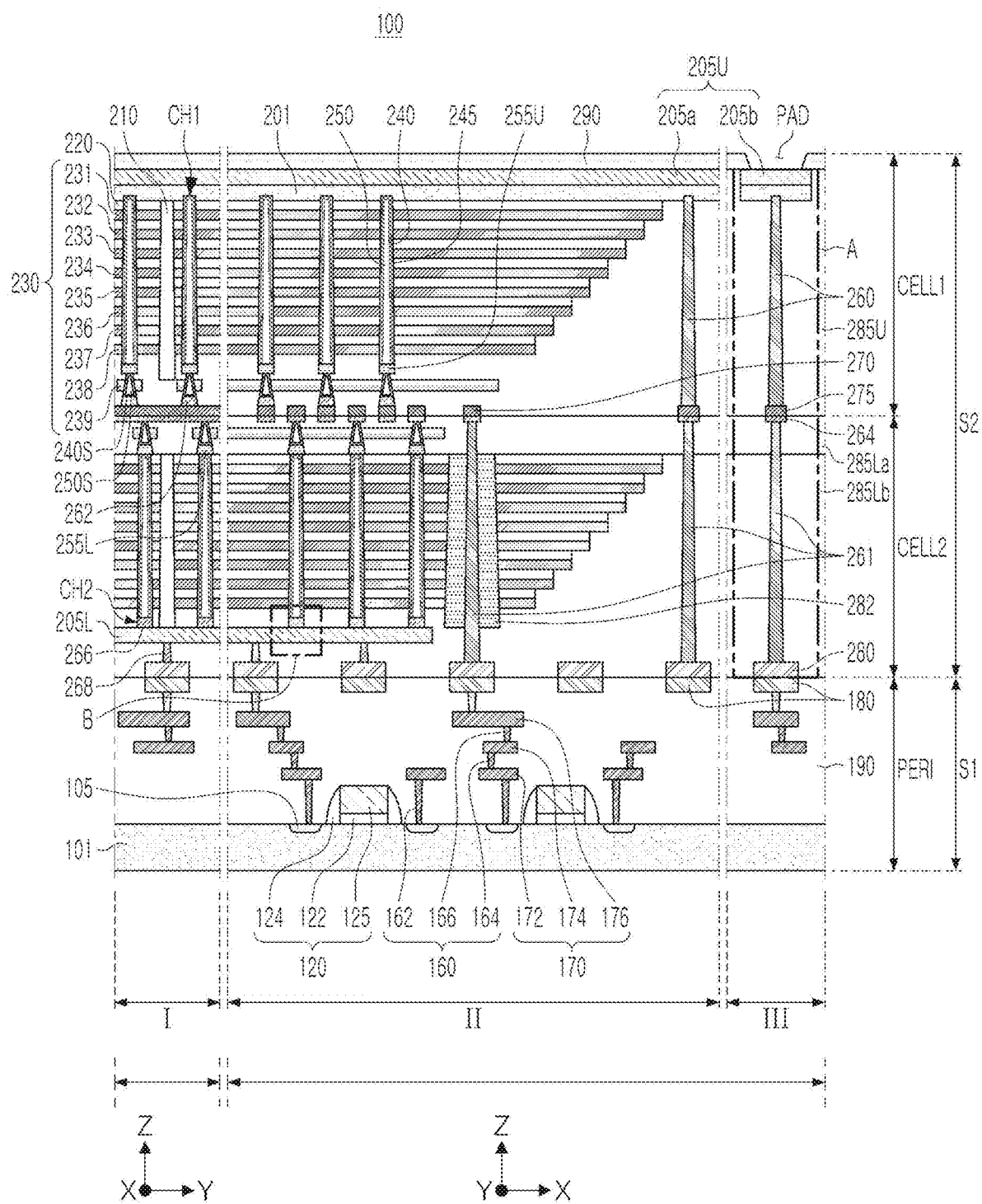
FIG. 4 is a schematic cross-sectional diagram illustrating a semiconductor device according to some example embodiments of the present inventive concepts.

FIG. 4 is a schematic cross-sectional diagram illustrating a semiconductor device according to some example embodiments.

Referring to FIG. 4, a semiconductor device 100 may include a first semiconductor structure S1 and a second semiconductor structure S2 stacked upwardly and downwardly. The first semiconductor structure S1 may include a peripheral circuit region PERI, as in the first semiconductor structure S1 illustrated in FIG. 3. The second semiconductor structure S2 may include memory cell regions CELL1 and CELL2, as in the second semiconductor structure S2 illustrated in FIG. 3. The semiconductor device 100 may include first to third regions I, II, and III, and the first and second regions I and II may be regions cut in directions perpendicular to each other, and the third region III may include a region in which a pad region PAD corresponding to the pad region PAD illustrated in FIG. 3 is disposed, and may be disposed on an external side of the first and second regions I and II.

The first semiconductor structure S1 may include a substrate 101, circuit devices 120 disposed on the substrate 101, circuit contact plugs 160, circuit wiring lines 170, and first bonding pads 180.

The substrate 101 may have an upper surface extending in an x direction and a y direction. The substrate 101 may include device isolation layers such that an active region may be defined. Source/drain regions 105 including impurities may be disposed in a portion of the active region. The substrate 101 may include a semiconductor material, such as a group IV semiconductor, a group III-V compound semiconductor, or a group II-VI compound semiconductor. For example, the substrate 101 may be provided as a single-crystal bulk wafer.

The circuit devices 120 may include a planar transistor. The circuit devices 120 each may include a circuit gate dielectric layer 122, a spacer layer 124, and a circuit gate electrode 125. The source/drain regions 105 may be disposed in the substrate 101 on both sides of the circuit gate electrode 125.

A peripheral region insulating layer 190 may be disposed on the circuit device 120 on the substrate 101. The circuit contact plugs 160 may penetrate through the peripheral region insulating layer 190 and may be connected to the source/drain regions 105, and may include first to third circuit contact plugs 162, 164, and 166 disposed in order from the substrate 101. An electrical signal may be applied to the circuit device 120 by the circuit contact plugs 160. In a region not illustrated, the circuit contact plugs 160 may also be connected to the circuit gate electrode 125. The circuit wiring lines 170 may be connected to the circuit contact plugs 160, and may include first to third circuit wiring lines 172, 174, and 176 forming a plurality of layers.

The first bonding pads 180 may be disposed to be connected to third circuit contact plugs 166, and upper surfaces of the first bonding pads 180 may be exposed to an upper surface of the first semiconductor structure S1 through the peripheral region insulating layer 190. The first bonding pads 180 included in the first semiconductor structure S1 may function as a bonding layer, along with second bonding pads 280 included in the second semiconductor structure S2, for bonding the first semiconductor structure S1 and a second semiconductor structure S2 with each other. The first bonding pads 180 may have a relatively large planar area as compared to areas of the other wiring structures in order to be bonded with (the second bonding pads 280 of) the second semiconductor structure S2 and to provide an electrical connection path accordingly. The first bonding pads 180 may be disposed in a position corresponding to the second bonding pads 280, and may have sizes the same as or similar to sizes of the second bonding pads 280. The first bonding pads 180 may include a conductive material, such as copper (Cu), for example.

The second semiconductor structure S2 may include a base layer 201 and first and second memory cell regions CELL1 and CELL2 stacked upwardly and downwardly on the base layer 201. The first memory cell region CELL1 may include gate electrodes 230 (e.g., gate electrodes 231 to 239) stacked on a lower surface of the base layer 201, interlayer insulating layers 220 alternately stacked with the gate electrodes 230, an isolation insulating layer 210 penetrating the gate electrodes 230, first channels CH1 penetrating the gate electrodes 230, string select channels 240S disposed in lower portions of the first channels CH1, first connection portions 262 disposed in lower portions of the string select channels 240S, common bit lines 270 disposed in lower portions of the first connection portions 262, and an upper cell region insulating layer 285U covering the gate electrodes 230. The first memory cell region CELL1 may further include an upper conductive layer 205U and a pad insulating layer 290 stacked in order and disposed on an upper surface of the base layer 201. The first memory cell region CELL1 may further include channel regions 240, gate dielectric layers 245, channel insulating layers 250, and first channel pads 255U, provided in the first channels CH1.

The second memory cell region CELL2 may include second connection portions 264 disposed on lower surfaces of the common bit lines 270, string select channels 240S disposed in lower portions of the second connection portions 264, second channel pads 255L disposed in lower portions of the string select channels 240S, second channels CH2 disposed in lower portions of the second channel pads 255L, third connection portions 266 disposed in lower portions of the second channels CH2, a lower conductive layer 205L disposed in lower portions of the third connection portions 266, fourth connection portions 268 disposed in a lower portion of the lower conductive layer 205L, and second bonding pads 280 connected to the fourth connection portions 268. The second memory cell region CELL2 may further include gate electrodes 230 surrounding the second channels CH2 and spaced apart from each other and stacked in a z direction, interlayer insulating layers 220 alternately stacked with the gate electrodes 230, an isolation insulating layer 210 penetrating the gate electrodes 230, and lower cell region insulating layers 285La and 285Lb covering the gate electrodes 230.

The second semiconductor structure S2 may further include first contact plugs 260 applying a signal to the upper conductive layer 205U, connection pads 275 disposed in parallel to the common bit lines 270, second connection portions 264 disposed in lower portions of the connection pads 275, and second contact plugs 261 connecting the second connection portions 264 to the second bonding pads 280, as wiring structures.

The base layer 201 may have a lower surface extending in an x direction and a y direction. The base layer 201 may include a semiconductor material. For example, the base layer 201 may be provided as a polycrystalline silicon layer or an epitaxial layer. The base layer 201 may include a doping region including impurities.

The gate electrodes 230 may be spaced apart from each other and stacked on a lower surface of the base layer 201 and may form a stack structure along with the interlayer insulating layers 220. The gate electrodes 230 may include a lower gate electrode 231 included in a gate of the ground select transistor GST illustrated in FIG. 2, memory gate electrodes 232 to 238 included in a plurality of memory cells MC, and an upper gate electrode 239 included in gates of string select transistors SST1 and SST2. Depending on capacity of the semiconductor device 100, the number of the memory gate electrodes 232 to 238 included in the memory cell MC may be determined. Depending on example embodiments, the number of the upper and lower gate electrodes 231 and 239 of the string select transistors SST1 and SST2 and the ground select transistor GST1 each may be one, or two or more. The ground select transistor GST provided by the lower gate electrode 231 may have a structure the same as or different from structures of the memory cells MC, and the string select transistors SST1 and SST2 provided by the upper gate electrode 239 may have a structure different from structures of the memory cells MC. The upper gate electrode 239 may be divided and disposed between each adjacent channels CH1 and CH2 on an x-y plane, differently from the other gate electrodes 231 to 238. Portions of the gate electrodes 230, such as one or more of the memory gate electrodes 232 to 238 adjacent to the upper and lower gate electrodes 231 and 239, for example, may be dummy gate electrodes.

The gate electrodes 230 may be spaced apart from each other and stacked perpendicularly to a lower surface of the base layer 201, and may extend in one direction by different lengths and may form stepped portions having a staircase shape. The gate electrodes 230 may form stepped portions as illustrated in FIG. 4 in the x direction, and may also form stepped portions in the y direction. By the stepped portions, the gate electrodes 230 may be configured such that a certain region including ends of the gate electrodes 230 may be exposed. In a region not illustrated, the gate electrodes 230 may be connected to other contact plugs on the stepped portions.

The gate electrodes 230 may be disposed to be isolated from each other with certain units by the isolation insulating layers 210 extending in the x direction. The gate electrodes 230 may form a single memory block between a pair of isolation insulating layers 210, but a range of the memory block is not limited thereto. Portions of the gate electrodes 230, such as the memory gate electrodes 232 to 238, for example, may form a single layer in a single memory block. The gate electrodes 230 may also have a through wiring region defined by a through insulating layer 282 in at least a partial region.

The interlayer insulating layers 220 may be disposed between the gate electrodes 230. The interlayer insulating layers 220 may also be spaced apart from each other in a direction perpendicular to a lower surface of the base layer 201 and may extend in the x direction, similarly to the gate electrodes 230. The interlayer insulating layers 220 may include an insulating material such as silicon oxide or silicon nitride, for example.

The first and second channels CH1 and CH2 may be spaced apart from each other and may form rows and columns on a lower surface of the base layer 201. The first and second channels CH1 and CH2 may be disposed in grid or zig-zag form in one direction. The first and second channels CH1 and CH2 each may have a cylindrical shape, and may have inclined side surfaces narrowing in width in a direction towards the base layer 201 in accordance with an aspect ratio. The first and second channels CH1 and CH2 may have inclined side surfaces inclined in the same direction. For example, the first and second channels CH1 and CH2 each may have inclined side surfaces such that widths of the first and second channels CH1 and CH2 may decrease towards upper portions thereof. In some example embodiments, portions of the first and second channels CH1 and CH2 may be dummy channels.

A channel region 240 may be disposed in the first and second channels CH1 and CH2. The channel regions 240 in the first and second channels CH1 and CH2 may have an annular shape surrounding the channel insulating layer 250 disposed therein, but a shape of the channel region 240 is not limited thereto. In some other example embodiments, the channel region 240 may have a column shape such as a shape of a cylinder or a prism, for example. The channel region 240 may include a semiconductor material such as polycrystalline silicon or single crystal silicon, and the semiconductor material may be an undoped material, or a material including p-type impurities or n-type impurities.

First and second channel pads 255U and 255L may be disposed on ends of the channel regions 240 adjacent to the common bit lines 270 in the first and second channels CH1 and CH2. The first and second channel pads 255U and 255L may cover surfaces of the channel insulating layers 250 and may be electrically connected to the channel regions 240. The first and second channel pads 255U and 255L may include undoped polycrystalline silicon, for example.

The gate dielectric layer 245 may be disposed between the gate electrodes 230 and the channel region 240. Although not illustrated in detail, the gate dielectric layer 245 may include a tunneling layer, a charge storage layer, and a blocking layer stacked in order from the channel region 240. The tunneling layer may tunnel electric charge to the charge storage layer, and may include silicon oxide ($SiO_2$), silicon nitride ($Si_3N_4$), silicon oxynitride (SiON), or combinations thereof, for example. The charge storage layer may be a charge trap layer or a floating gate conductive layer. The blocking layer may include silicon oxide ($SiO_2$), silicon nitride ($Si_3N_4$), silicon oxynitride (SiON), a high-k material, or combinations thereof. In some example embodiments, at least a portion of the gate dielectric layer 245 may extend in a horizontal direction along the gate electrodes 230.

The channel region 240 may be directly connected to the base layer 201 or the third connection portion 266 on ends on which the channel pads 255U and 255L are not disposed.

The string select channels 240S may be disposed between the first and second channel pads 255U and 255L and the common bit lines 270. The string select channels 240S may penetrate through the upper gate electrode 239 such that first ends of the string select channels 240S may respectively be connected to the channel pads 255U and 255L, and second ends of the string select channels 240S may respectively be connected to the first and second connection portions 262 and 264. The string select channels 240S in the first memory cell region CELL1 may be disposed in a single through hole extending to the first connection portions 262, and the string select channels 240S in the second memory cell region CELL2 may be disposed in a single through hole extending to the second channel pads 255L, but some other example embodiments thereof are not limited thereto. In some example embodiments, the terms "first channels CH1 and second channels CH2" may also refer to a region including the through hole in a broad sense. The channel region 240 may include a semiconductor material such as polycrystalline silicon or single crystal silicon, and the semiconductor material may be an undoped material, or a material including p-type impurities or n-type impurities.

A string insulating layer 250S filling the through hole may be disposed in the string select channels 240S. In some other example embodiments, the string select channels 240S may fill the through hole. The string insulating layer 250S may include an insulating material such as silicon oxide, silicon nitride, and the like.

The first connection portions 262 may connect the string select channels 240S disposed in lower portion of the first channels CH1 and the common bit lines 270. The second connection portions 264 may connect the common bit lines 270 and the string select channels 240S in upper portions of the second channels CH2 in lower portions of the common bit lines 270. The third connection portions 266 may connect the second channels CH2 and the lower conductive layer 205L in lower portions of the second channels CH2. The fourth connection portions 268 may be contact plugs connecting the lower conductive layer 205L and the second bonding pads 280.

The first to fourth connection portions 262, 264, 266, and 268 each may include conductive materials. For example, the first to third connection portions 262, 264, and 266 may include doped polycrystalline silicon, and the fourth connection portions 268 may include a metal material such as tungsten (W), aluminum (Al), copper (Cu), tungsten nitride (WN), tantalum nitride (TaN), titanium nitride (TiN), or combinations thereof, for example.

The common bit lines 270 may be disposed between the first connection portions 262 and the second connection portions 264 on lower ends of the first connection portions 262. The common bit lines 270 may be connected to the first and second channels CH1 and CH2 in common, and may be the bit lines BL0 to BL2 illustrated in FIG. 2. The semiconductor device 100 may have relatively high integration density by the common bit lines 270. The common bit lines 270 may include a semiconductor material such as polycrystalline silicon, or a metal material such as tungsten (W), aluminum (Al), copper (Cu), tungsten nitride (WN), tantalum nitride (TaN), titanium nitride (TiN), or combinations thereof, for example.

The upper conductive layer 205U may include first and second conductive layers 205a and 205b spaced apart from each other. The first and second conductive layers 205a and 205b may be formed in the same process, and may be formed of the same material and may have the same thickness on the same height level. In other words, respective upper surfaces and lower surfaces of the first and second conductive layers 205a and 205b may be coplanar with each other. The lower conductive layer 205L may be disposed in lower portions of the second channels CH2. Upper and lower conductive layers 205U and 205L may include a metal material. For example, the upper and lower conductive layers 205U and 205L may include tungsten (W), aluminum (Al), copper (Cu), tungsten nitride (WN), tantalum nitride (TaN), titanium nitride (TiN), or combinations thereof.

A first conductive layer 205a of the upper conductive layer 205U may be disposed in upper portions of the first and second regions I and II of the base layer 201, and may overlap the gate electrodes 230 and the first channels CH1 on a plane. The first conductive layer 205a may have a plate shape, and may function as the common source line CSL illustrated in FIG. 2 in the semiconductor device 100. The first conductive layer 205a may receive an electrical signal from a peripheral circuit region PERI through the first contact plugs 260 and the base layer 201, and the base layer 201 may include doping elements in at least a portion thereof. The first conductive layer 205a may also be directly connected to the first contact plug 260 in some example embodiments.

A second conductive layer 205b may be physically and electrically isolated from the first conductive layer 205a, and may be disposed in parallel to the first conductive layer 205a in the x direction. Accordingly, the base layers 201 may be also be isolated from each other in the first and second regions I and II and the third region III of the base layers 201 along with the first and second conductive layers 205a and 205b. The second conductive layer 205b may be configured to not overlap the gate electrodes 230 and the first channels CH1 on a plane. The second conductive layer 205b may be disposed in an upper portion of the third region III of the base layer 201, and may overlap the first contact plugs 260 on a plane. The second conductive layer 205b may be connected to an electrical connection structure such as a signal transferring medium in a device such as a package in which the semiconductor device 100 is mounted, through an upper surface. In other words, the second conductive layer 205b exposed to an upper portion may function as a pad region PAD. The second conductive layer 205b may be electrically connected to an input and output circuit of the peripheral circuit region PERI in the semiconductor device 100. In the semiconductor device 100, the second conductive layer 205b may be formed using a process of forming the first conductive layer 205a used as the common source line CSL, and the second conductive layer 205b may be used as a pad region PAD for input and output operations in relation to an external entity, thereby significantly reducing an overall thickness and simplifying the processes. The second conductive layer 205b may have a width within a range of 50 µm to 200 µm in one direction, but some other example embodiments thereof are not limited thereto.

The lower conductive layer 205L may be disposed in lower portions of the second channels CH2 in the first and second regions I and II of the base layer 201, and may overlap the gate electrodes 230 and the second channels CH2 on a plane. The lower conductive layer 205L may have a plate shape, and may function as the common source line CSL illustrated in FIG. 2 in the semiconductor device 100 along with the first conductive layer 205a. The lower conductive layer 205L may receive an electrical signal from the peripheral circuit region PERI through the fourth connection portions 268 and the second bonding pads 280.

A pad insulating layer 290 may be disposed on the upper conductive layer 205U. The pad insulating layer 290 may have an opening configured to open a partial region of the second conductive layer 205b, and the opening may allow the second conductive layer 205b to be exposed to an upper portion. In other words, the pad insulating layer 290 may define the pad region PAD. For example, a plurality of the openings may be disposed to form a column as illustrated in FIG. 3. By the openings, an upper surface of the semiconductor device 100 may have a recessed region. Also, the pad insulating layer 290 may function as a passivation layer protecting the semiconductor device 100.

The pad insulating layer 290 may include at least one of silicon oxide, silicon nitride, and silicon carbide. In some example embodiments, the pad insulating layer 290 may have a form in which a plurality of layers are stacked. In this case, a lower layer may be formed of a material having excellent adhesive properties with the upper conductive layer 205U, and an upper layer may be formed of a material having excellent adhesive properties with silicon (Si). For example, the lower layer may include silicon oxide, and the upper layer may include silicon nitride. Also, in some example embodiments, a passivation layer (not shown) may also be disposed on the pad insulating layer 290 to protect the semiconductor device 100. The passivation layer may be formed of a photosensitive resin material such as a photosensitive polyimide (PSPI), but some other example embodiments of the material are not limited thereto. For example, the passivation layer may include an insulating material such as silicon nitride, silicon oxide, and the like.

The first contact plugs 260 may penetrate through the upper cell region insulating layer 285U and may be connected to the base layer 201 or the upper conductive layer 205U, and may be connected to the connection pads 275 on the other ends. In some example embodiments, the first contact plugs 260 may penetrate through the base layer 201 and may be directly connected to the upper conductive layer 205U. The first contact plugs 260 may also be connected to the gate electrodes 230 in a region not illustrated. The second contact plugs 261 may penetrate through the lower cell region insulating layers 285La and 285Lb and may connect the second connection portions 264 and the second bonding pads 280. Portions of the second contact plugs 261 may be disposed to penetrate a through insulating layer 282 penetrating the gate electrodes 230. The through insulating layer 282 may include an insulating material, and may include wiring structures including the second contact plugs 261 therein.

The first and second contact plugs 260 and 261 each may have a cylindrical shape. The first and second contact plugs 260 and 261 may also have inclined side surfaces narrowing in width in a direction towards the base layer 201 in accordance with an aspect ratio. In some example embodiments, the first and second contact plugs 260 and 261 may have different diameters and/or different heights in the second region II and the third region III. In some example embodiments, portions of the first and second contact plugs 260 and 261 may be dummy contact plugs to which an electrical signal is not applied.

The connection pads 275 may be formed in the same process as the process of forming the common bit lines 270 such that the connection pads 275 and the common bit lines 270 may be formed of the same material, may be disposed on the same level, and may have the same thickness. In other words, respective upper surfaces and lower surfaces of the connection pads 275 and the common bit lines 270 may be coplanar with each other. The connection pads 275 may not be the bit lines BL0 to BL2 illustrated in FIG. 2, differently from the common bit lines 270, and may function as a connection portion connecting the first and second contact plugs 260 and 261 along with the second connection portions 264 on lower surfaces of the connection pads 275.

In the third region III, the second conductive layer 205b included in the pad region PAD may be electrically connected to the circuit devices 120 in the peripheral circuit region PERI in a lower portion through the first contact plug 260, the connection pad 275, the second connection portion 264, the second contact plug 261, and the second bonding pad 280 in order. Thus, even in the case in which heights of the cell region insulating layers 285U, 285La, and 285Lb are relatively high, the second conductive layer 205b may be electrically connected to the peripheral circuit region PERI stably.

The second bonding pads 280 may be disposed in lower portions of the fourth connection portions 268, and lower surfaces of the second bonding pads 280 may be exposed to a lower surface of the second semiconductor structure S2 through the second lower cell region insulation layer 285Lb. The second bonding pads 280 included in the second semiconductor structure S2 may function as a bonding layer, along with the first bonding pads 180 included in the first semiconductor structure S1, for bonding the first semiconductor structure S1 and the second semiconductor structure S2 with each other along. The second bonding pads 280 may have a relatively large area as compared to other wiring structures to be bonded with (the first bonding pads 180 of) the first semiconductor structure S1 and to provide an electrical connection path accordingly.

The second bonding pads 280 may be arranged to form certain patterns in the first to third regions I, II, and III. The second bonding pads 280 may be disposed on the same level in the first to third regions I, II, and III, and may have the same size or different sizes. The second bonding pads 280 each may have a quadrilateral shape, a circular shape, or an oval shape on a plane, but the shapes of the second bonding pads 280 are not limited thereto. The second bonding pads 280 may include a conductive material, such as copper (Cu), for example.

The cell region insulating layers 285U, 285La, and 285Lb may be formed of an insulating material. The cell region insulating layers 285U, 285La, and 285Lb each may include a plurality of insulating layers formed in different stages of processes. Thus, the division between the cell region insulating layers 285U, 285La, and 285Lb may be understood as an example. In some example embodiments, the second lower cell region insulating layer 285Lb may include a bonding dielectric layer (not shown) having a certain thickness on a lower end on which the second bonding pad 280 is disposed. The bonding dielectric layer may also be disposed on a lower surface of the first semiconductor structure S1, and a dielectric-to-dielectric bonding may be implemented by the bonding dielectric layer. The bonding dielectric layer may also function as a diffusion barrier layer of the second bonding pad 280. For example, the bonding dielectric layer may include at least one of SiO, SiN, SiCN, SiOC, SiON, and/or SiOCN.

The first and second semiconductor structures S1 and S2 may be bonded with each other by bonding between the first and second bonding pads 180 and 280, a copper (Cu)-to-copper (Cu) bonding, for example. The first and second bonding pads 180 and 280 may have relatively large areas as compared to areas of the other elements of the wiring structure, and thus, reliability of electrical connections between the first and second semiconductor structures S1 and S2 may improve. In some example embodiments, the first and second semiconductor structures S1 and S2 may also be bonded with each other by a hybrid bonding, implemented by bonding between the first and second bonding pads 180 and 280 and a dielectric-to-dielectric bonding between the cell region insulating layer 285 and the peripheral region insulating layer 190 disposed in the circumference of the first and second bonding pads 180 and 280.

FIGS. 5A and 5B are schematic cross-sectional diagrams illustrating partial elements of a semiconductor device according to some example embodiments. FIGS. 5A and 5B illustrate a region corresponding to region "A" illustrated in FIG. 4 in magnified form.

Referring to FIG. 5A, differently from the example embodiment in FIG. 4, a first connection portion 262a may further be disposed on a first contact plug 260a connected to a pad region PAD. The first connection portion 262a may have a form in which the first connection portion 262a may extend into a through hole forming string select channels 240S, and may fill the entirety of the through holes, differently from the connection portion in first and second regions I and II. Also, in some example embodiments, a through portion 256 and a fourth connection portion 268 may further be disposed upwardly and downwardly of a second contact plug 261a electrically connected to the pad region PAD. The through portion 256 may extend into the through hole forming the string select channels 240S, and may fill overall through holes, differently from the second channel pads 255L in the first and second regions I and II.

Thus, a second conductive layer 205b forming the pad region PAD may be connected to a peripheral circuit region PERI in a lower portion through the first contact plug 260a, the first connection portion 262a, the connection pad 275, the second connection portion 264, the through portion 256, the second contact plug 261a, the fourth connection portion 268, and the second bonding pad 280 in order. In some example embodiments, as the first connection portion 262a, the through portion 256, and the fourth connection portion 268 are disposed, the first and second contact plugs 260a and 261a may have relatively small heights, and thus, a process may easily be performed.

Referring to FIG. 5B, differently from the example embodiment in FIG. 5A, a connection pad 275a may further include a plug portion extending upwardly. Thus, the connection pad 275a may be connected to the first connection portion 262a through the plug portion. Although not illustrated, common bit lines 270 each may include such a plug portion in the first and second regions I and II.

Figure 6A:
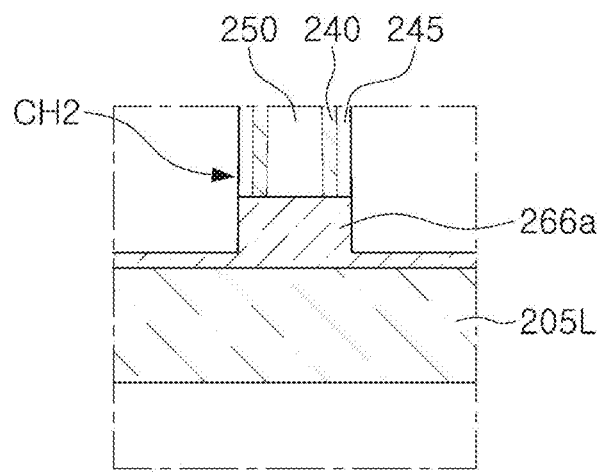
FIGS. 6A and 6B are schematic cross-sectional diagrams illustrating partial elements of a semiconductor device according to some example embodiments of the present inventive concepts.
Figure 6B:
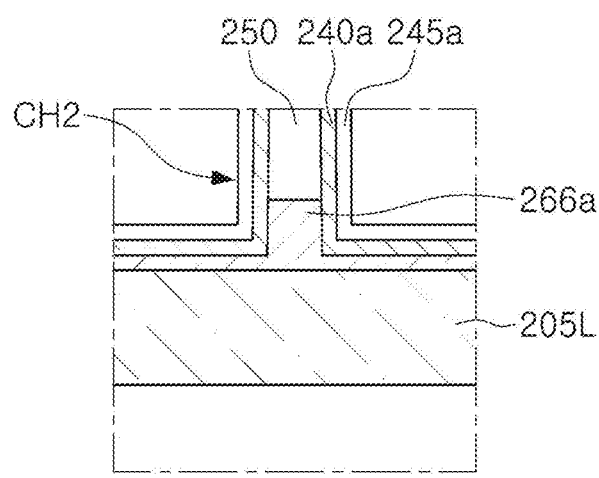

FIGS. 6A and 6B are schematic cross-sectional diagrams illustrating partial elements of a semiconductor device according to an example embodiment. FIGS. 6A and 6B illustrate a region corresponding to region "B" illustrated in FIG. 4 in magnified form.

Referring to FIG. 6A, in some example embodiments, a third connection portion 266a may extend onto an upper surface of a lower conductive layer 205L from a second channel CH2, differently from the example embodiment in FIG. 4. Accordingly, a third connection portion 266a may be disposed in plate form in a lower portion along with the lower conductive layer 205L.

Referring to FIG. 6B, a channel region 240a of a second channel CH2 and a gate dielectric layer 245a may also extend onto an upper surface of the lower conductive layer 205L, along with the third connection portion 266a.

Figure 7A:
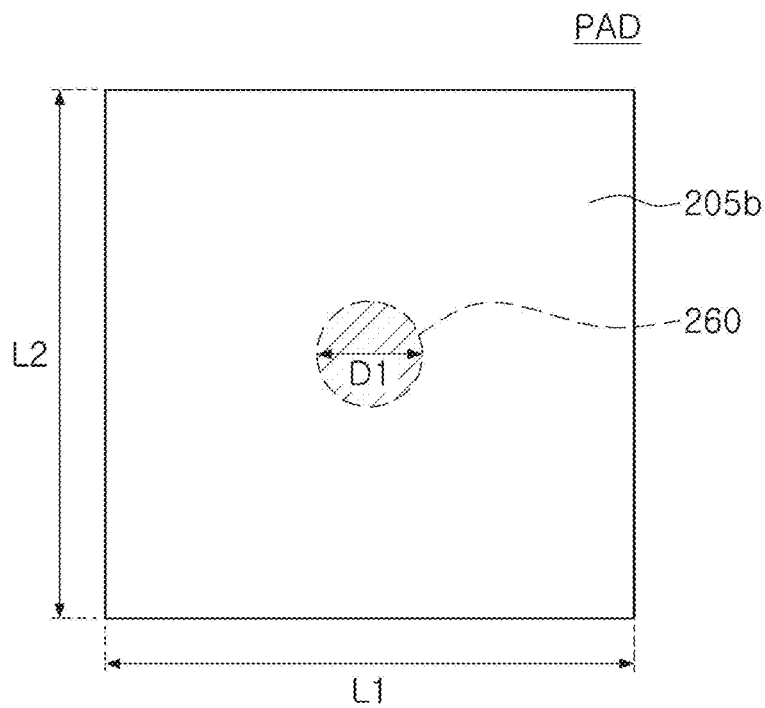
FIGS. 7A and 7B are schematic diagrams illustrating a layout of partial elements of a semiconductor device according to some example embodiments of the present inventive concepts.
Figure 7B:
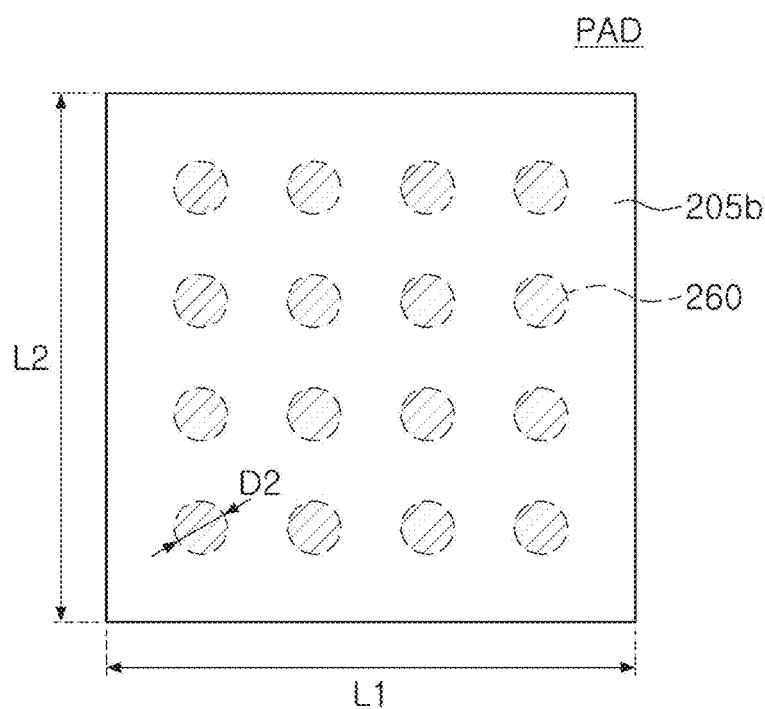

FIGS. 7A and 7B are schematic diagrams illustrating a layout of partial elements of a semiconductor device according to some example embodiments.

FIGS. 7A and 7B illustrate arrangement of a second conductive layer 205b and first contact plugs 260 on a plane in the pad region PAD in FIG. 4. The second conductive layer 205b may be exposed by an opening of the pad insulating layer 290 illustrated in FIG. 4, and a region forming a single pad region PAD is illustrated in a plan view.

The second conductive layer 205b may have a quadrilateral shape in the pad region PAD, and may have a first length L1 in an x direction and may have a second length L2 in a y direction. The first and second lengths L1 and L2 may be the same or different from each other, and may have a range of 20 μm to 100 μm, for example. In some other example embodiments, a shape of the second conductive layer 205b exposed through the opening is not limited to a quadrilateral shape, and may have various shapes such as a circular shape, an oval shape, a polygonal shape, and the like.

As illustrated in FIG. 7A, a single first contact plug 260 may be connected to a second conductive layer 205b forming a single pad region PAD in a lower portion. A first diameter D1 or a maximum width of the first contact plug 260 may be within a range of 100 nm to 10 μm. In this case, the first contact plug 260 may be disposed in a central portion of the second conductive layer 205b, but some other example embodiments thereof are not limited thereto.

As illustrated in FIG. 7B, a plurality of first contact plugs 260 may be connected to the second conductive layer 205b forming a single pad region PAD in a lower portion. In this case, when a wire is bonded to the pad region PAD, supporting force may improve, and accordingly, stress applied to the semiconductor device may be alleviated. The first contact plugs 260 may be arranged to form a column and a row. A second diameter D2 or a maximum width of each of the first contact plugs 260 may be within a range of 100 nm to 500 nm, for example, and the second diameter D2 or the maximum width may be the same or lower than the first diameter D1 illustrated in FIG. 7A.

Figure 8A:
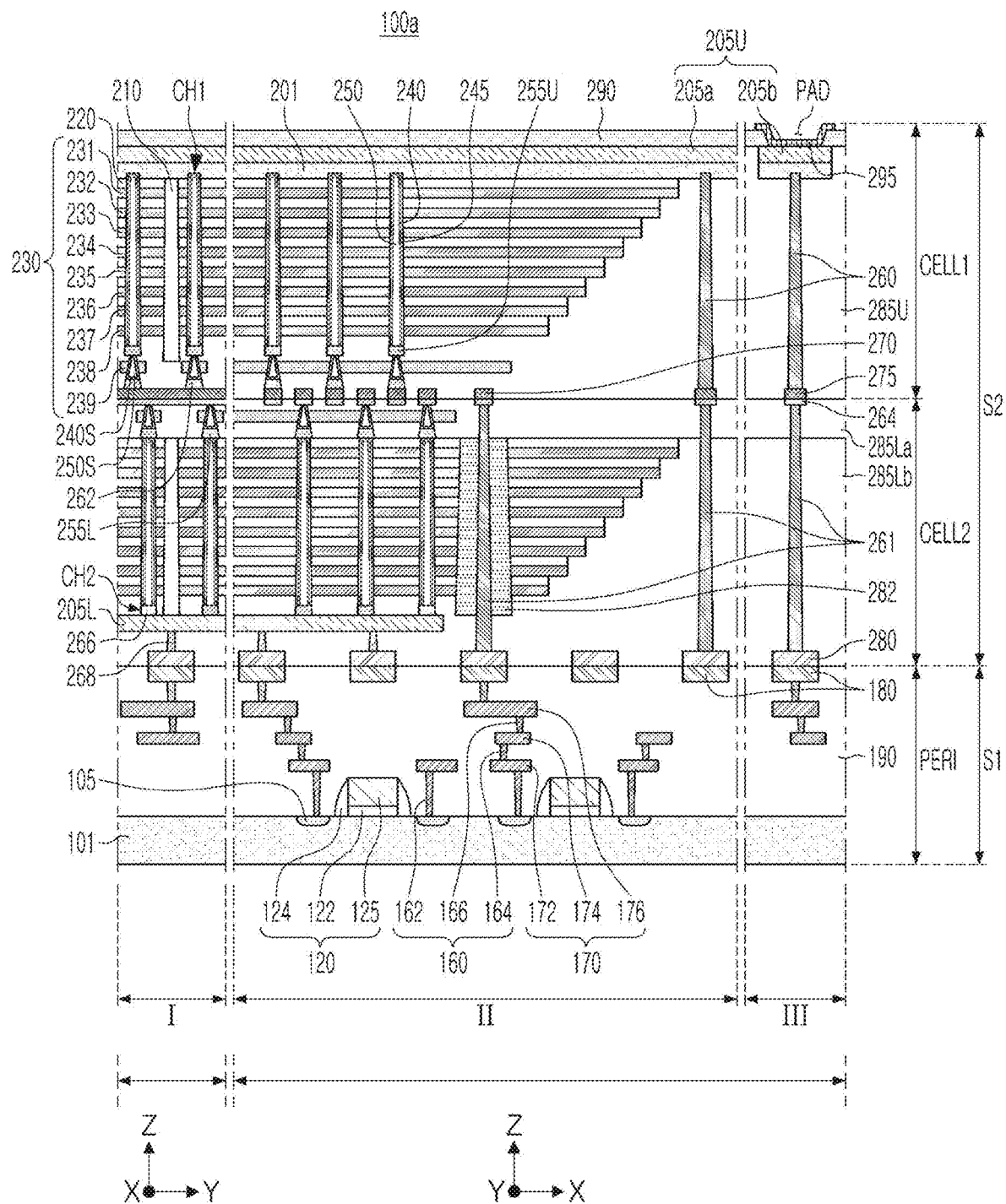
FIGS. 8A to 8C are schematic cross-sectional diagrams illustrating a semiconductor device according to some example embodiments of the present inventive concepts.
Figure 8B:
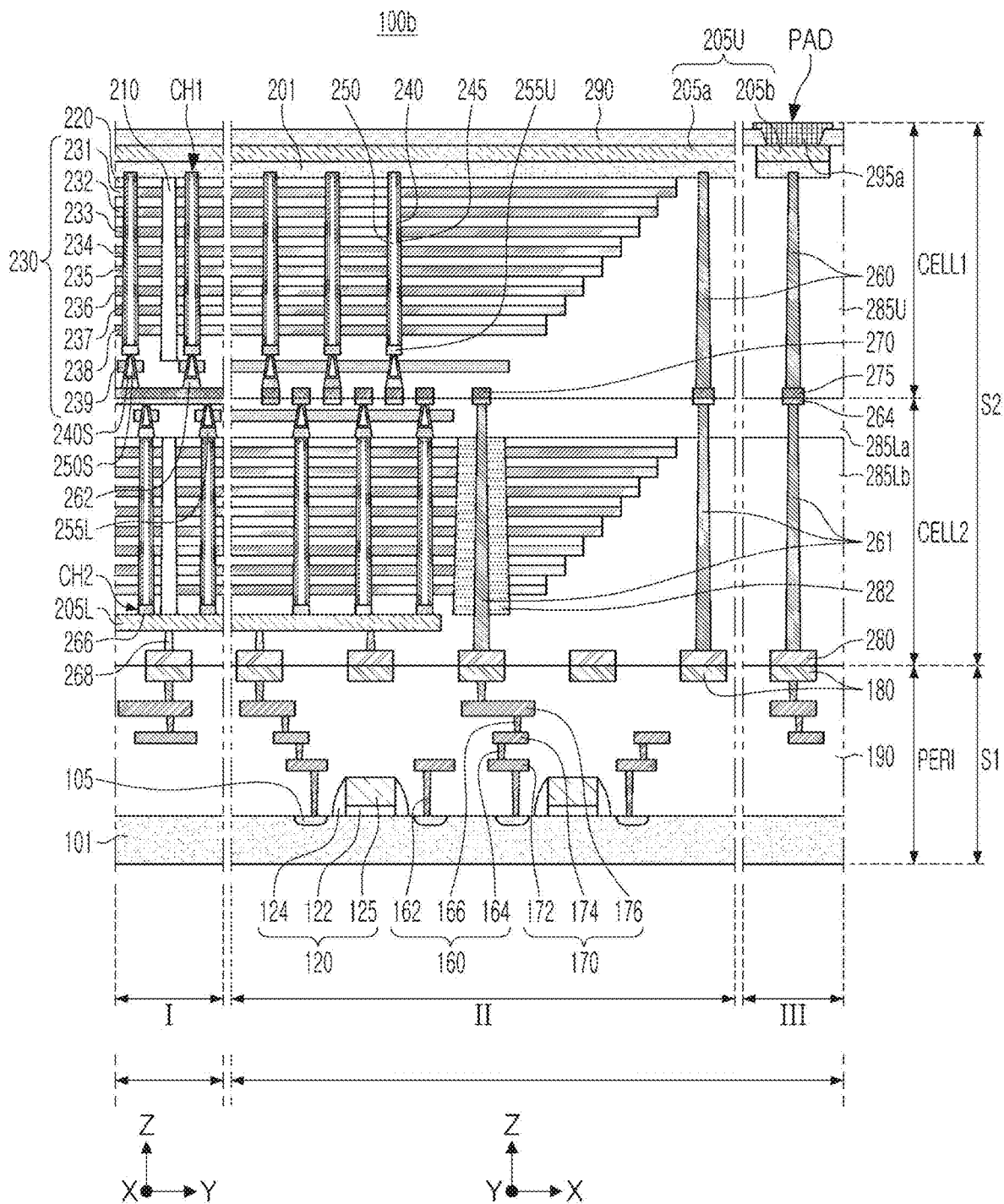
Figure 8C:
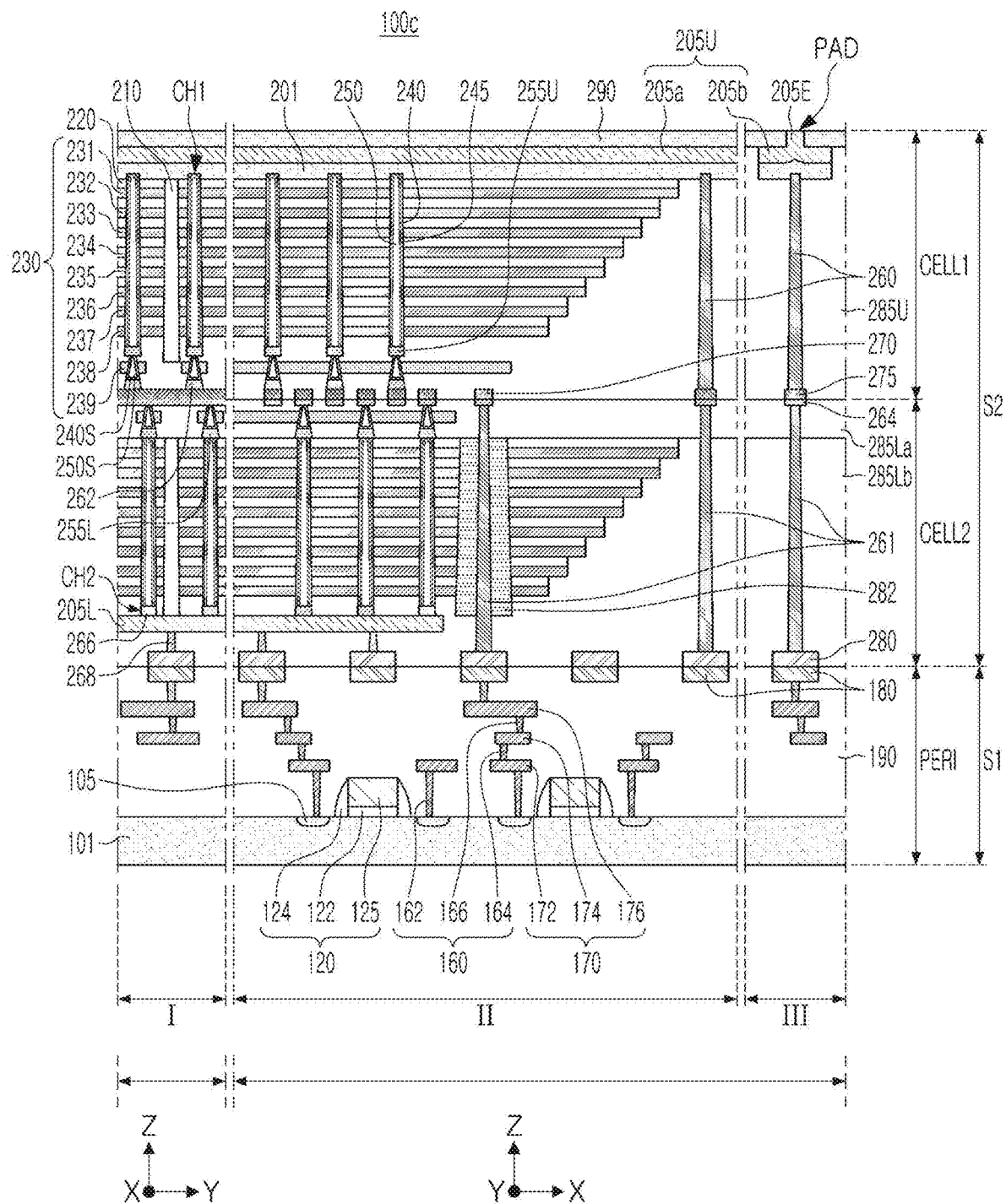

FIGS. 8A to 8C are schematic cross-sectional diagrams illustrating a semiconductor device according to some example embodiments.

Referring to FIG. 8A, a second semiconductor structure S2 of a semiconductor device 100a may further include a connection layer 295 disposed on the second conductive layer 205b of a pad region PAD.

The connection layer 295 may be disposed on an upper surface of the second conductive layer 205b exposed through an opening of the pad insulating layer 290, and may extend onto a portion of an upper surface of the pad insulating layer 290 along side surfaces of the pad insulating layer 290 from an upper surface of the second conductive layer 205b. In some other example embodiments, however, the connection layer 295 may be disposed only on the exposed upper surface of the second conductive layer 205b. In this case, the connection layer 295 may be a surface treatment layer. The connection layer 295 may include a material different from a material of the second conductive layer 205b, and may be a metal layer such as aluminum (Al), for example. The connection layer 295 may be formed of a metal material having excellent interdiffusion and excellent cohesion force with an external electrical connection structure connected to the exposed second conductive layer 205b, a wire material, for example.

Referring to FIG. 8B, a connection layer 295a of a semiconductor device 100b may fill an opening of the pad insulating layer 290 and may be disposed on a portion of an upper surface of the pad insulating layer 290. Accordingly, the connection layer 295a may protrude from an upper surface of the semiconductor device 100b. The connection layer 295a may be formed of a single layer or may be formed of a plurality of layers.

Referring to FIG. 8C, in the second semiconductor structure S2 of a semiconductor device 100c, the second conductive layer 205b of the pad region PAD may further include an extended portion 205E extending to penetrate the pad insulating layer 290. The semiconductor device 100c may have a form in which the extended portion 205E of the second conductive layer 205b penetrates through the pad insulating layer 290 and is exposed to an upper portion, rather than a form in which a portion of the second conductive layer 205b is exposed by an opening of the pad insulating layer 290, differently from the example embodiment in FIG. 4. A lower surface of the second conductive layer 205b may have a concave portion in a region corresponding to the extended portion 205E, but some other example embodiments thereof are not limited thereto. The concave portion may be formed by filling a conductive material forming the extended portion 205E when the second conductive layer 205b is formed. In the pad region PAD, a width of the second conductive layer 205b in the example embodiment illustrated in FIG. 8C may be smaller than the width of the second conductive layer 205b in the example embodiment illustrated in FIG. 4. A width of the second conductive layer 205b may be relatively smaller than the aforementioned example embodiment of FIG. 4 because, in the example embodiment of FIG. 8C, as the extended portion 205E is formed before the opening of the pad insulating layer 290 is formed, a process margin may be different from the example embodiment illustrated in FIG. 4, so that the second conductive layer 205b can be formed smaller.

In some example embodiments, the extended portion 205E of the second conductive layer 205b may protrude to certain height from an upper surface of the pad insulating layer 290. Also, in some example embodiments, the extended portion 205E of the second conductive layer 205b may have an inclined side wall, and may have a tapered shape in which a width of an upper surface is narrower than a width of a lower surface, for example. The extended portion 205E may have a shape such as a cylindrical shape, a tapered cylindrical shape, a trench shape, and the like, but a shape of the extended portion 205E is not limited thereto. In some example embodiments, a connection layer (not shown) may further be disposed on the extended portion 205E, similarly to the connection layer 295 as shown in the example embodiment illustrated in FIG. 8A.

Figure 9:
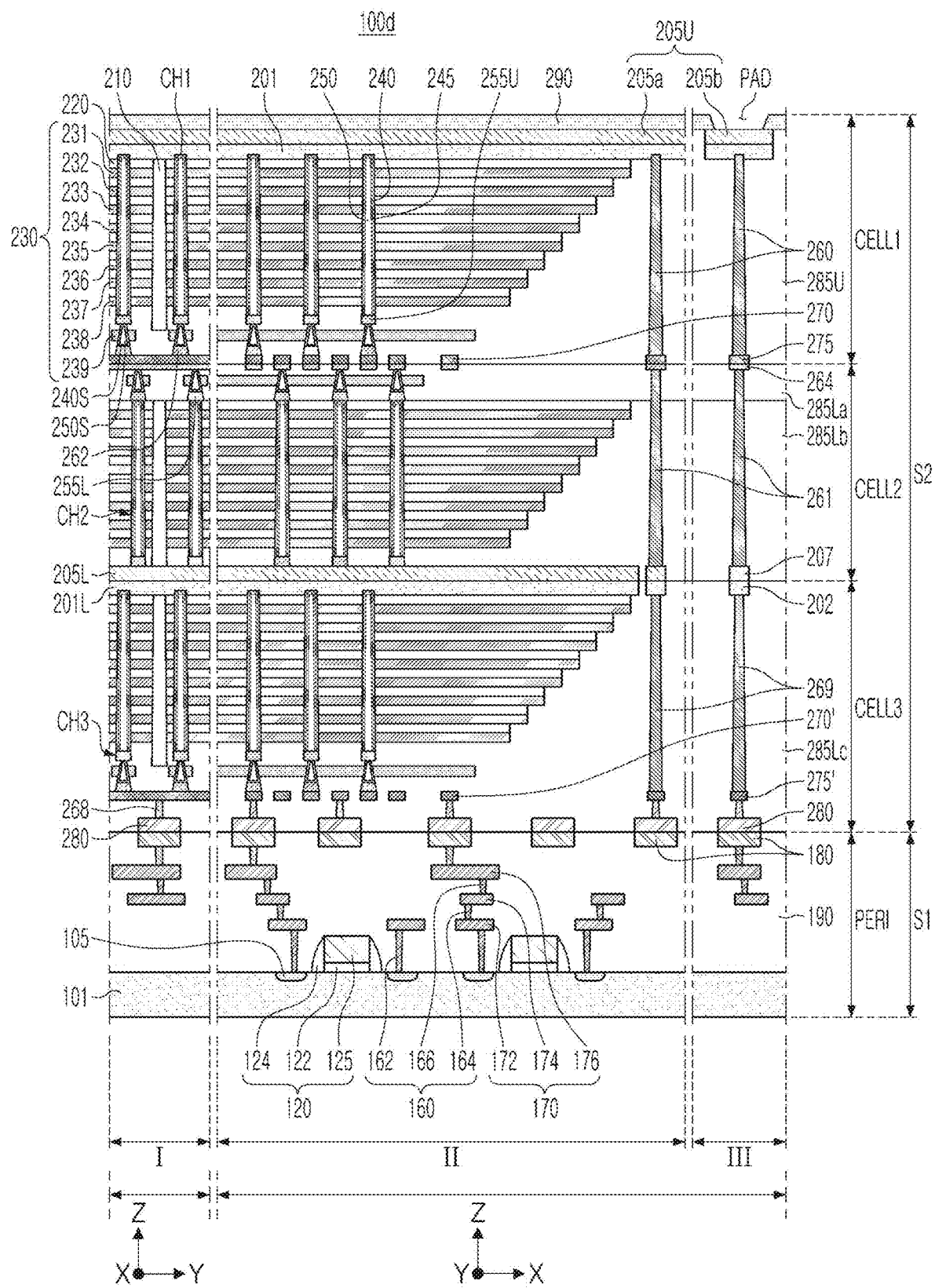
FIG. 9 is a schematic cross-sectional diagram illustrating a semiconductor device according to some example embodiments of the present inventive concepts.

FIG. 9 is a schematic cross-sectional diagram illustrating a semiconductor device according to some example embodiments.

Referring to FIG. 9, a second semiconductor structure S2 of a semiconductor device 100d may further include a third memory cell region CELL3. The third memory cell region CELL3 may be disposed in a lower portion of a second memory cell region CELL2, and may include a lower substrate 201L disposed on a lower surface of a lower conductive layer 205L, third channels CH3 disposed on the lower substrate 201L, gate electrodes 230 surrounding the third channels CH3 and spaced apart from each other and stacked in a z direction, interlayer insulating layers 220, an isolation insulating layer 210 penetrating the gate electrodes 230, and a lower cell region insulating layer 285Lc covering the gate electrodes 230.

The third channels CH3 may have a structure in which the third channels CH3 may share a common source line CSL (see FIG. 2) provided to the lower conductive layer 205L with the upper second channels CH2. The third channels CH3 may be connected to bit lines 270' in a lower portion isolated from the common bit lines 270 of the first and second channels CH1 and CH2. In some example embodiments, the number of memory cell regions disposed in the second semiconductor structure S2 may vary. In the case in which a plurality of memory cell regions are provided, the common bit lines 270 or the common source line CSL may be shared between the memory cell regions disposed adjacently to each other upwardly and downwardly.

The third memory cell region CELL3 may further include the string select channels 240S disposed on a lower surface of the third channels CH3, the first connection portions 262 disposed in a lower portion of the string select channels 240S, the bit lines 270' disposed in a lower portion of the first connection portions 262, the fourth connection portions 268 disposed in a lower portion of the bit lines 270', and the second bonding pads 280 disposed in a lower portion of the fourth connection portions 268.

The second memory cell region CELL2 may further include a conductive pad 207 disposed on the same height level as the level of the lower conductive layer 205L in the third region III, and the third memory cell region CELL3 may further include a semiconductor pad 202 disposed on the same height level as the level of the lower substrate 201L, a third contact plug 269, and a lower connection pad 275' disposed on the same height level as the level of the bit lines 270'. The conductive pad 207 may be formed in the same process step as that of the lower conductive layer 205L, and the semiconductor pad 202 may be formed in the same process step as that of the lower substrate 201L. Thus, the conductive pad 207 and the semiconductor pad 202 may be formed of materials the same as materials of the lower conductive layer 205L and the lower substrate 201L, respectively, and may have thicknesses the same as thicknesses of the lower conductive layer 205L and the lower substrate 201L, respectively. The third contact plug 269 may penetrate through the lower cell region insulating layer 285Lc and may connect the semiconductor pad 202 with the lower connection pad 275'.

In the third region III, the pad region PAD, the second conductive layer 205b may be electrically connected to circuit devices 120 in a peripheral circuit region PERI through the first contact plug 260, the connection pad 275, the second connection portion 264, the second contact plug 261, the conductive pad 207, the semiconductor pad 202, the third contact plug 269, the lower connection pad 275', the fourth connection portion 268, and the second bonding pad 280 in order.

FIGS. 10A to 10J are schematic cross-sectional diagrams illustrating a method of manufacturing a semiconductor device according to some example embodiments. FIGS. 10A to 10J illustrate a region corresponding to the region illustrated in FIG. 4.

Figure 10A:
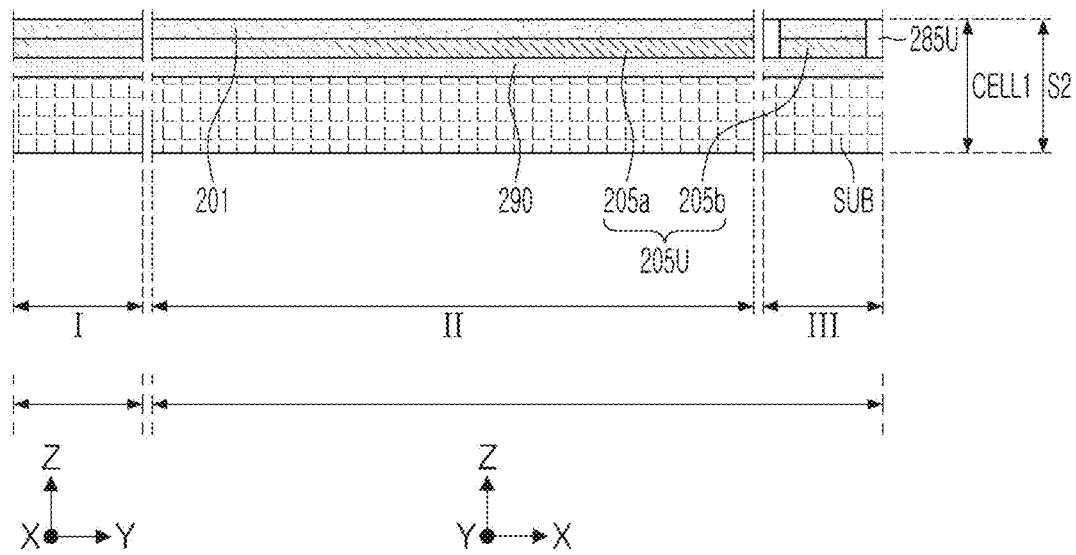
FIGS. 10A to 10J are schematic cross-sectional diagrams illustrating a method of manufacturing a semiconductor device according to some example embodiments of the present inventive concepts.

Referring to FIG. 10A, a second semiconductor structure S2 illustrated in FIG. 4 may be formed. To this end, a pad insulating layer 290, an upper conductive layer 205U, and a base layer 201 may be formed in order on a base substrate SUB.

The base substrate SUB may be removed through a subsequent process, and may be a semiconductor substrate such as silicon (Si), for example. In FIG. 4, the layers disposed on the base layer 201 may be formed on the base substrate SUB in reverse order.

The upper conductive layer 205U and the base layer 201 may be formed and patterned such that the upper conductive layer 205U and the base layer 201 may be separated between first and second regions I and II and a third region III by a cell region insulating layer 285U. Accordingly, the upper conductive layer 205U may include first and second conductive layers 205a and 205b spaced apart from each other. The cell region insulating layer 285U may be a layer forming an upper cell region insulating layer 285U illustrated in FIG. 4 along with an insulating layer formed in a subsequent process. In the example embodiment in FIG. 8C, the corresponding structure may be manufactured by forming an opening by patterning the pad insulating layer 290 and forming an extended portion 205E by filling the opening when the upper conductive layer 205U is formed.

Figure 10B:
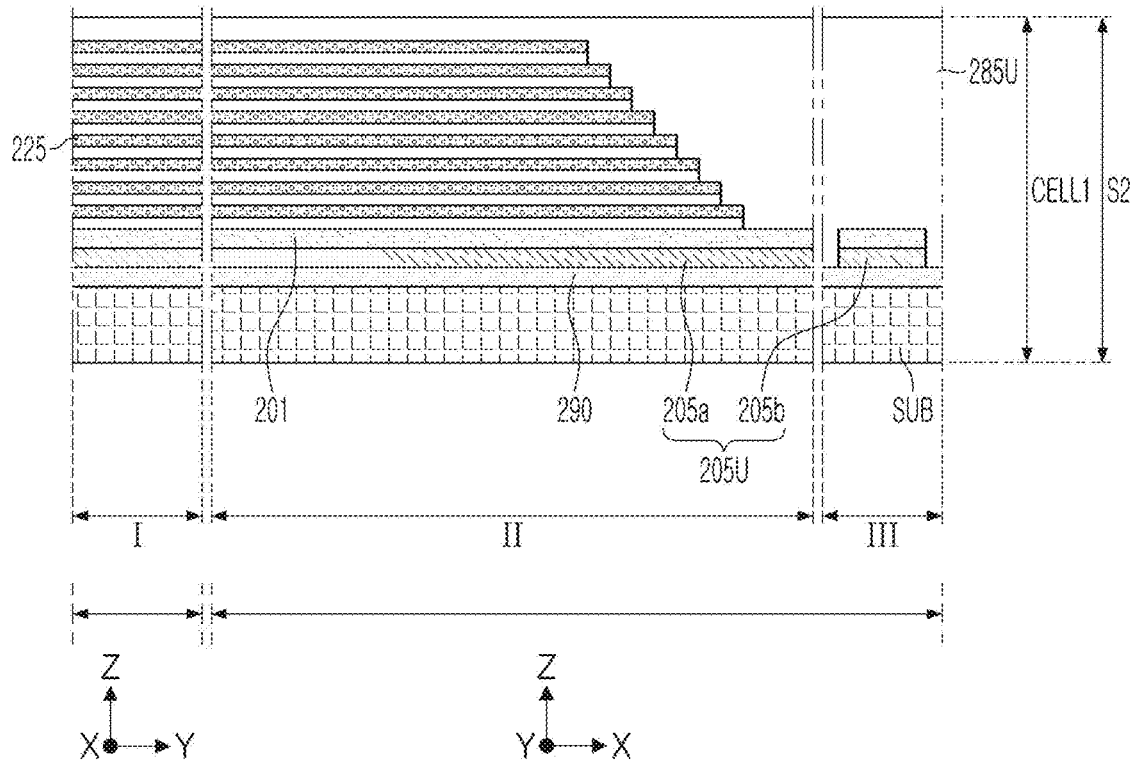

Referring to FIG. 10B, sacrificial layers 225 and interlayer insulating layers 220 may be alternately layered on the base layer 201, and the sacrificial layers 225 and the interlayer insulating layers 220 may be partially removed such that the sacrificial layers 225 may extend by different lengths.

The sacrificial layers 225 may be layers replaced with gate electrodes 230 through a subsequent process. The sacrificial layers 225 may be formed of a material having etch selectivity and etched in relation to the interlayer insulating layers 220. For example, the interlayer insulating layers 220 may be formed of at least one of silicon oxide and/or silicon nitride, and the sacrificial layer 225 may be formed of a material different from a material of the interlayer insulating layers 220, selected among silicon, silicon oxide, silicon carbide, and/or silicon nitride. In some example embodiments, thicknesses of the interlayer insulating layers 220 may not be equal to one another.

A photolithography process and an etching process may be repeatedly performed to the sacrificial layer 225 and the interlayer insulating layers 220 such that the upper sacrificial layer 225 may extend by a length shorter than a length of the extended lower sacrificial layer 225. Accordingly, the sacrificial layer 225 may form a staircase shape. In some example embodiments, the sacrificial layer 225 may have a thickness relatively greater than a thickness of the other portion thereof on an end, and an additional process may be performed accordingly. An upper cell region insulating layer 285U may be formed by depositing an insulating material covering an upper portion of a stack structure of the sacrificial layers 225 and the interlayer insulating layers 220.

Figure 10C:
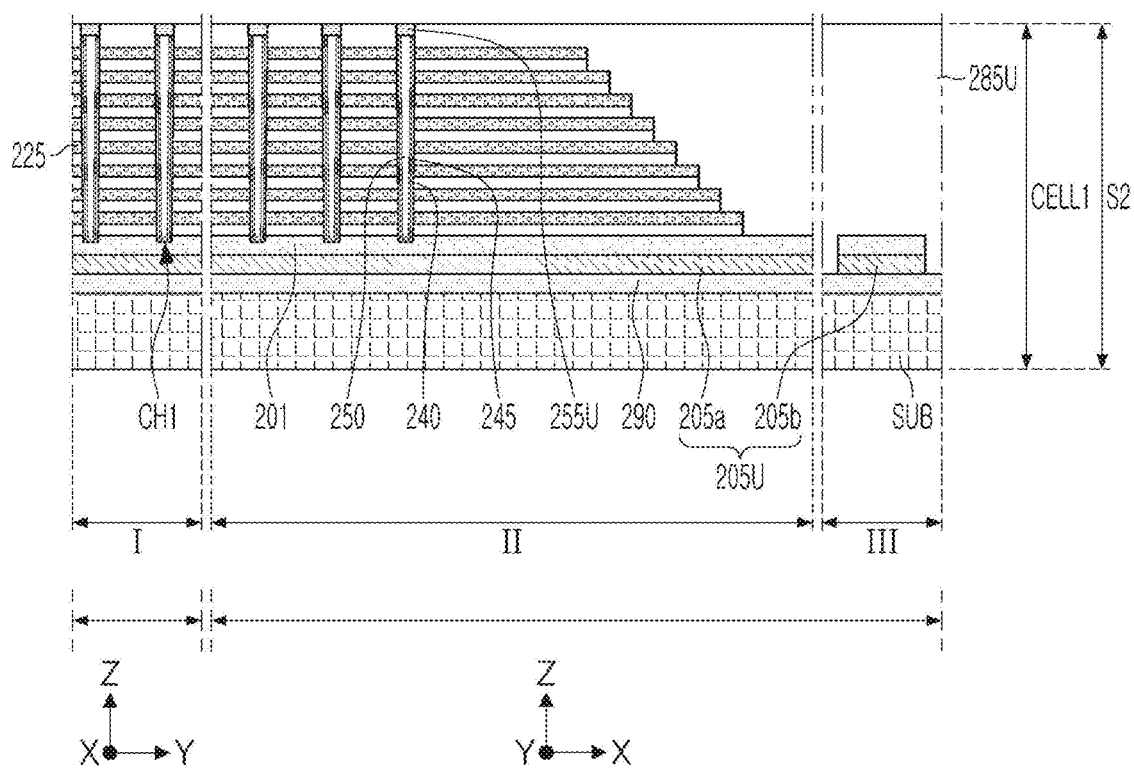

Referring to FIG. 10C, first channels CH1 penetrating through a stack structure of the sacrificial layer 225 and the interlayer insulating layers 220 may be formed.

To form the first channels CH1, channel holes may be formed by anisotropically etching the stack structure. Due to a height of the stack structure, side walls of the channel holes may not be perpendicular to an upper surface of the base layer 201. In some example embodiments, the channel holes may be formed such that the base layer 201 may be partially recessed. The channel holes, however, may not extend to an upper conductive layer 205U.

The first channels CH1 may be formed by forming a channel region 240, a gate dielectric layer 245, a channel insulating layer 250, and first channel pads 255U in the channel holes. The gate dielectric layer 245 may have a uniform thickness through an atomic layer deposition (ALD) process or a chemical vapor deposition (CVD) process. In this stage, at least a portion of the gate dielectric layer 245 may be configured to extend vertically along the channel region 240. The channel region 240 may be formed on the gate dielectric layer 245 in the first channels CH1. A channel insulating layer 250 may charge the first channels CH1, and may be an insulating material. In some other example embodiments, however, a space between the channel regions 240 may be filled with a conductive material rather than the channel insulating layer 250. First channel pads 255U may be formed of a conductive material, such as polycrystalline silicon, for example.

Figure 10D:
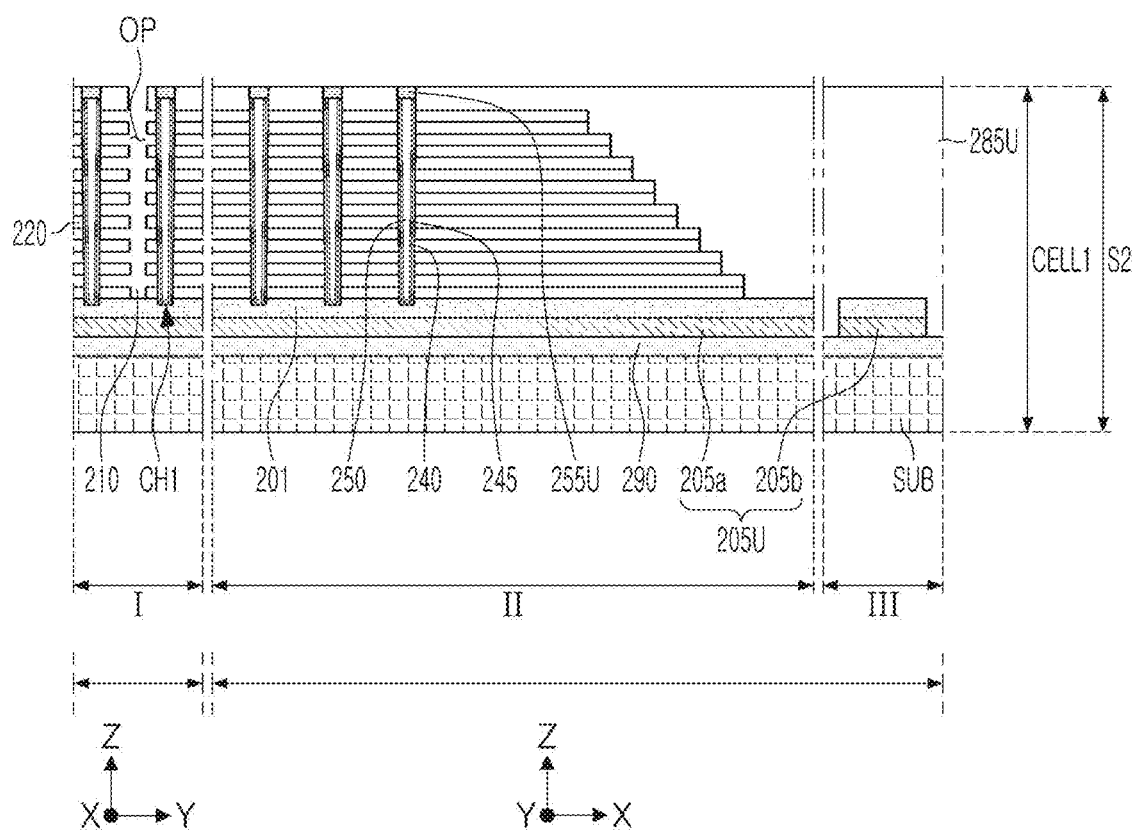

Referring to FIG. 10D, openings OP penetrating through a stack structure of sacrificial layers 225 and interlayer insulating layers 220 may be formed, and the sacrificial layers 225 may be removed through the openings OP.

The openings OP are illustrated in a first region I, and may be formed in trench form extending in an x direction. The sacrificial layer 225 may be selectively removed in relation to the interlayer insulating layers 220 using a wet etching process. Accordingly, side walls of the first channels CH1 may be partially exposed between the interlayer insulating layers 220.

Figure 10E:
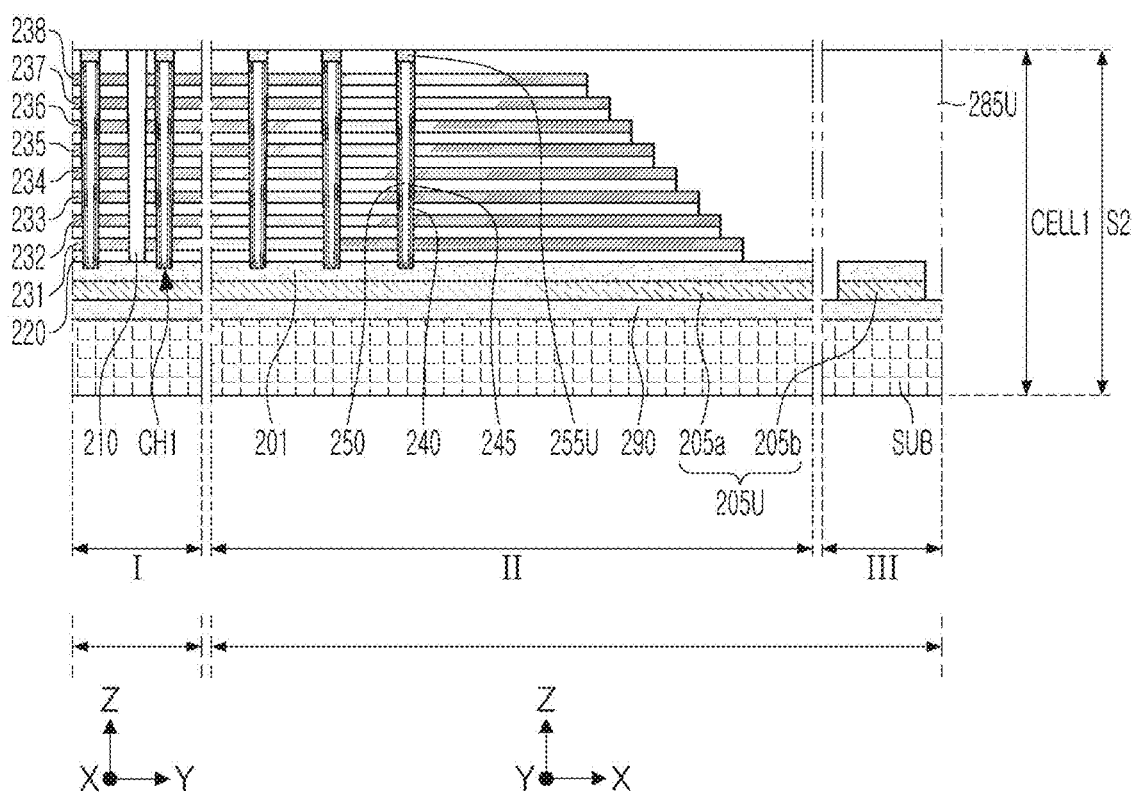

Referring to FIG. 10E, portions of gate electrodes 231 to 238 may be formed in a region in which sacrificial layers 225 are removed.

The gate electrodes 231 to 238 may be formed by filling a conductive material in a region in which the sacrificial layers 225 are removed. The gate electrodes 231 to 238 may include metal, polycrystalline silicon, or a metal silicide material. In some example embodiments, before the gate electrodes 231 to 238 are formed, in the case in which gate dielectric layers 245 have a region extending horizontally along the gate electrodes 231 to 238 is present, the region may be formed first. In a region not illustrated, an isolation insulating layer 210 may be formed by filling an insulating material in openings OP.

Figure 10F:
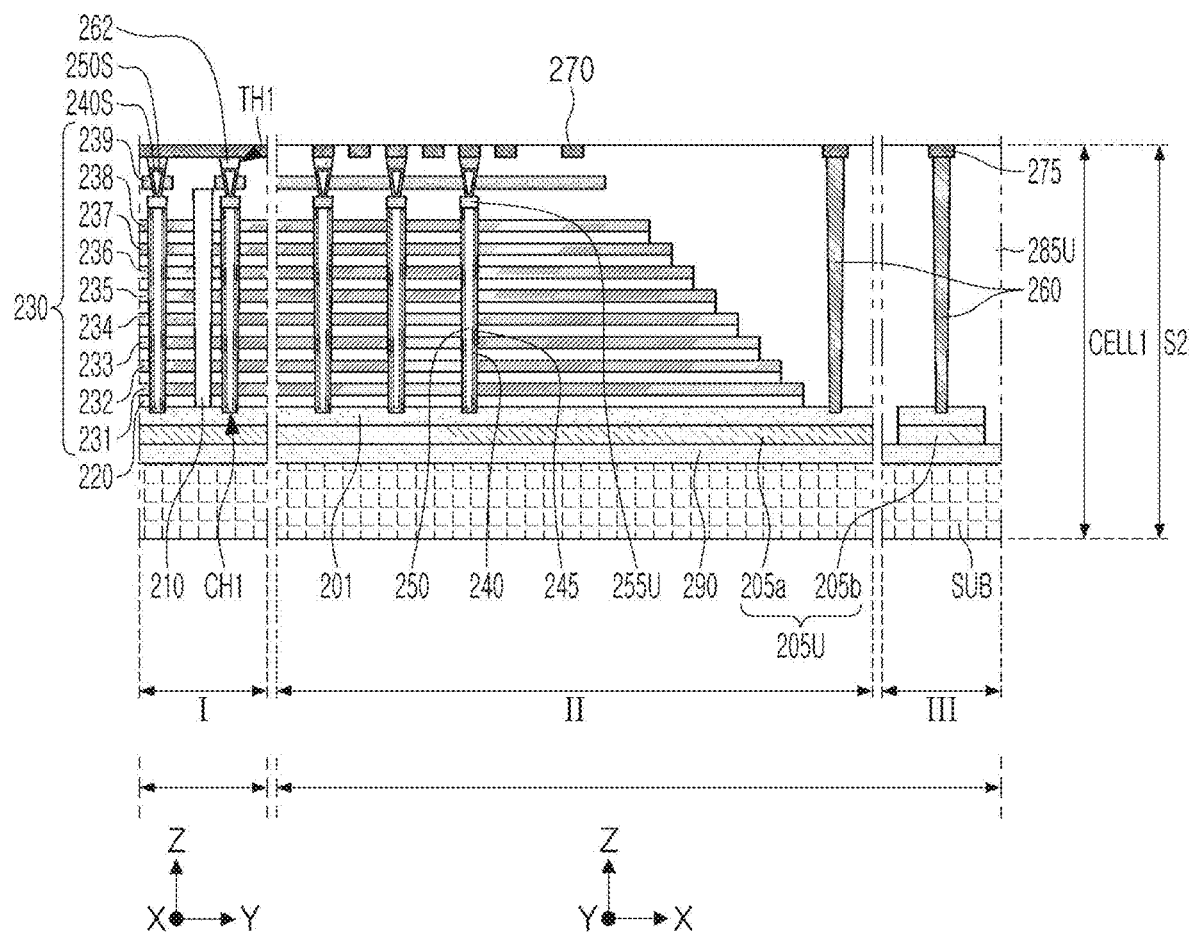

Referring to FIG. 10F, an upper gate electrode 239, string select channels 240S, string insulating layers 250S, first connection portions 262, first contact plugs 260, common bit lines 270, and connection pads 275 may be formed.

The upper gate electrode 239 may be formed by depositing a conductive material, such as polycrystalline silicon, for example, on the first channels CH1. An upper cell region insulating layer 285U material may be additionally stacked, and first through holes TH1 penetrating through the upper cell region insulating layer 285U may be formed. The string select channels 240S and the string insulating layers 250S may be filled in the first through holes TH1, and an upper portion may be filled with a conductive material, thereby forming the first connection portions 262. Through holes penetrating through the upper cell region insulating layer 285U may be formed, first contact plugs 260 may be formed by filling a conductive material, and common bit lines 270 and connection pads 275 may be formed on the first connection portions 262 and the first contact plugs 260, respectively. The common bit lines 270 and the connection pads 275 may be formed by depositing a conductive material and through a patterning process, or may be formed by partially patterning the upper cell region insulating layer 285U and depositing a conductive material. Accordingly, a first memory cell region CELL1 may be formed.

Figure 10G:
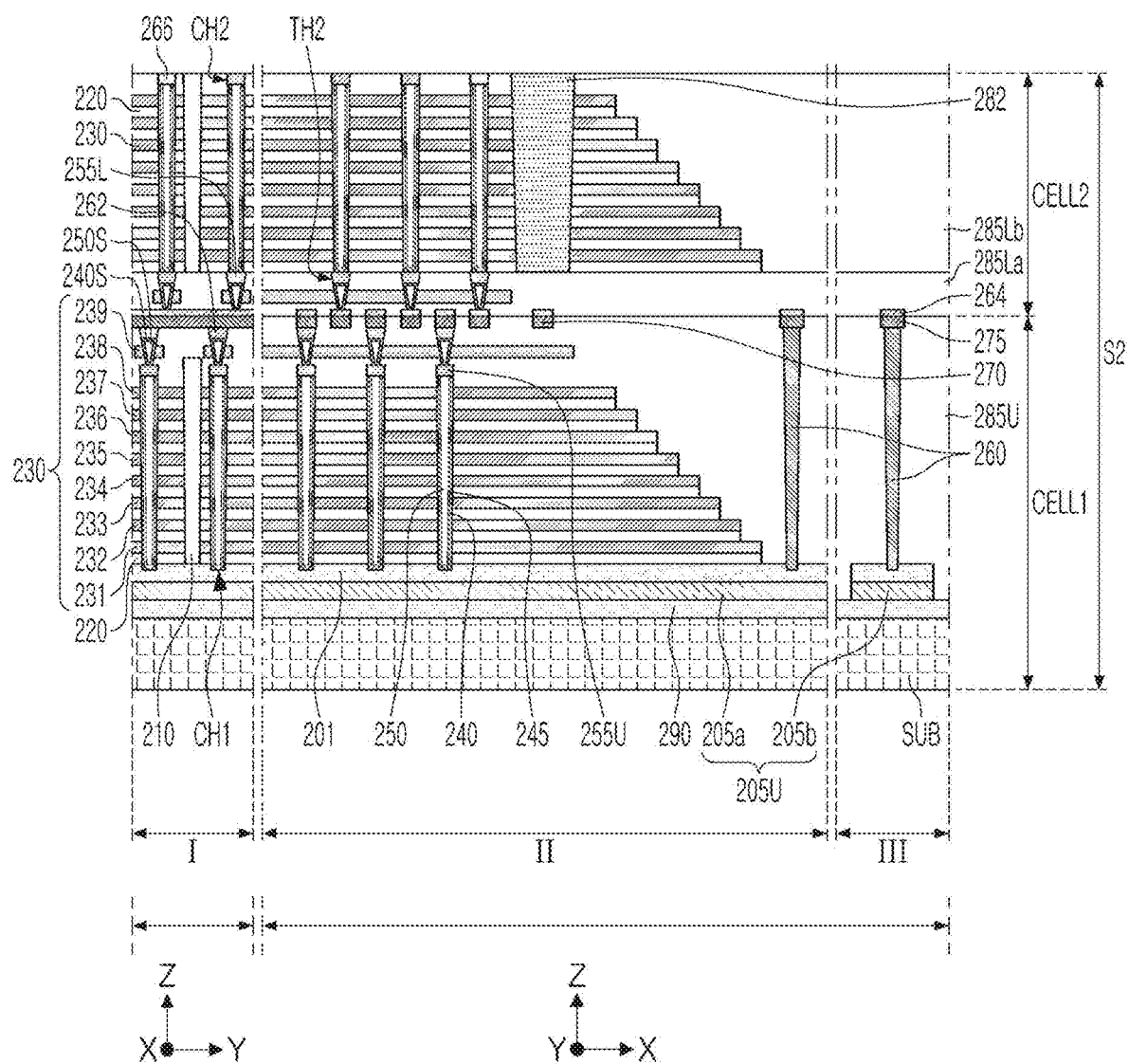

Referring to FIG. 10G, second connection portions 264, an upper gate electrode 239, string select channels 240S, string insulating layers 250S, second channel pads 255L, gate electrodes 230, second channels CH2, and third connection portions 266 of a second memory cell region CELL2 may be formed.

The second memory cell region CELL2 may be formed by a method similar to the method of forming the first memory cell region CELL1. Second connection portions 264 may be formed on the common bit lines 270 and the connection pads 275. The second connection portions 264 may be patterned together with the common bit lines 270 and the connection pads 275. A portion of a lower cell region insulating layer 285La may be formed on the second connection portions 264, and the upper gate electrode 239 may be formed.

A portion of the lower cell region insulating layer 285La may be formed again, and second through holes TH2 penetrating through the portion of the lower cell region insulating layer 285La may be formed. The string select channels 240S and the string insulating layers 250S may be filled in the second through holes TH2, and an upper portion may be filled with a conductive material, thereby forming second channel pads 255L.

As described with reference to FIGS. 10B and 10C, gate electrodes 230, second channels CH2, and third connection portions 266 may be formed. Also, a through insulating layer 282 penetrating through gate electrodes 231 to 238 may be formed in an outer region of the gate electrodes 230.

Figure 10H:
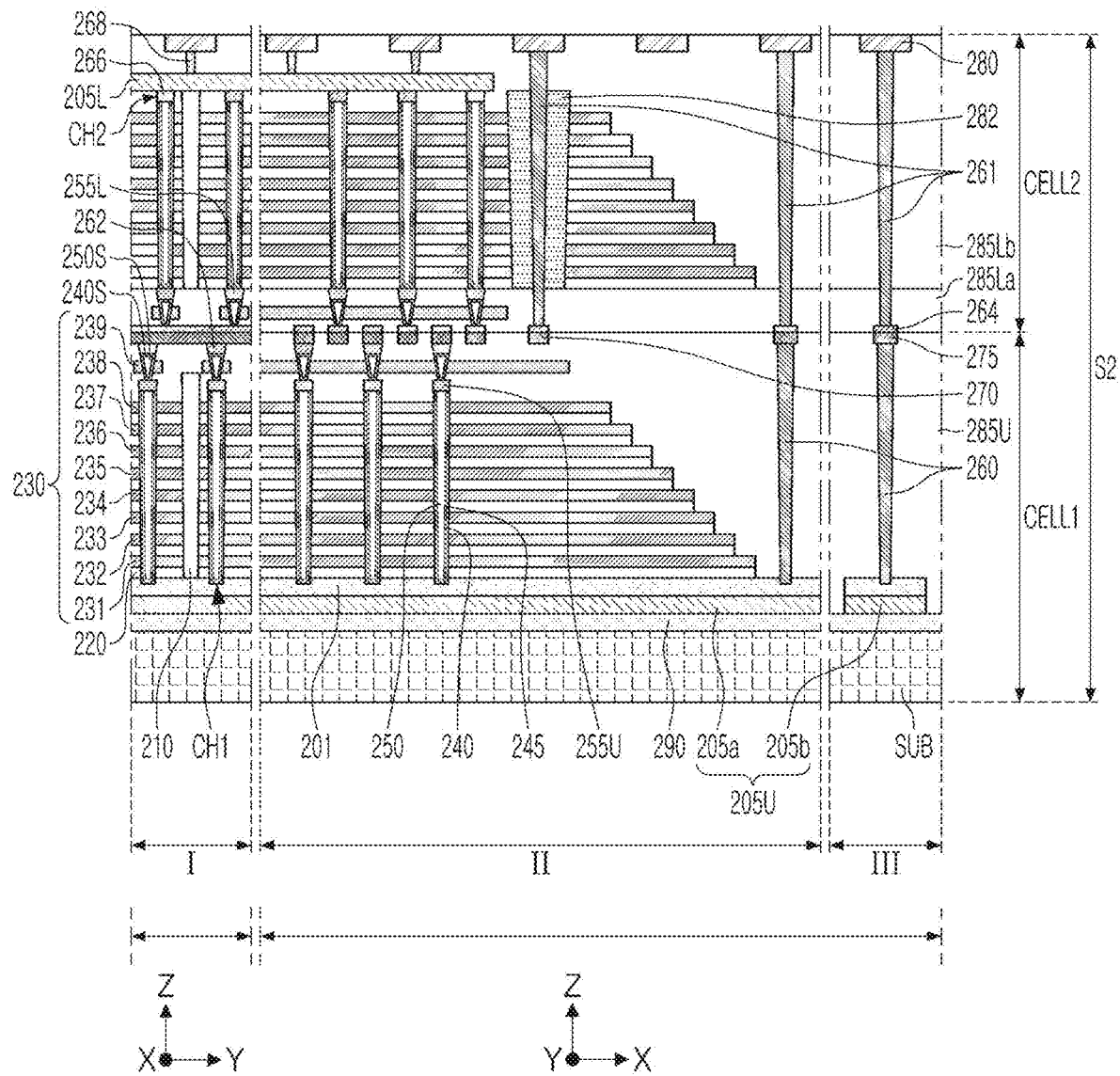

Referring to FIG. 10H, a lower conductive layer 205L, fourth connection portions 268, second contact plugs 261, and second bonding pads 280 may be formed.

The lower conductive layer 205L may be formed on third connection portions 266, and fourth connection portions 268 may be formed on the lower conductive layer 205L. A through hole penetrating through lower cell region insulating layers 285La and 285Lb and a through insulating layer 282 may be formed, and a conductive material may be filled, thereby forming the second contact plugs 261.

The second bonding pads 280 may be formed on the fourth connection portions 268 and the second contact plugs 261. The second bonding pads 280 may be formed by depositing a conductive material and through a patterning process, for example. Upper surfaces of the second bonding pads 280 may be exposed through the lower cell region insulating layer 285Lb, and may form a portion of an upper surface of a second semiconductor structure S2. In some example embodiments, upper surfaces of the second bonding pads 280 may further extend to an upper portion than an upper surface of the lower cell region insulating layer 285Lb. Through this stage, a second semiconductor structure S2 may be prepared.

Figure 10I:
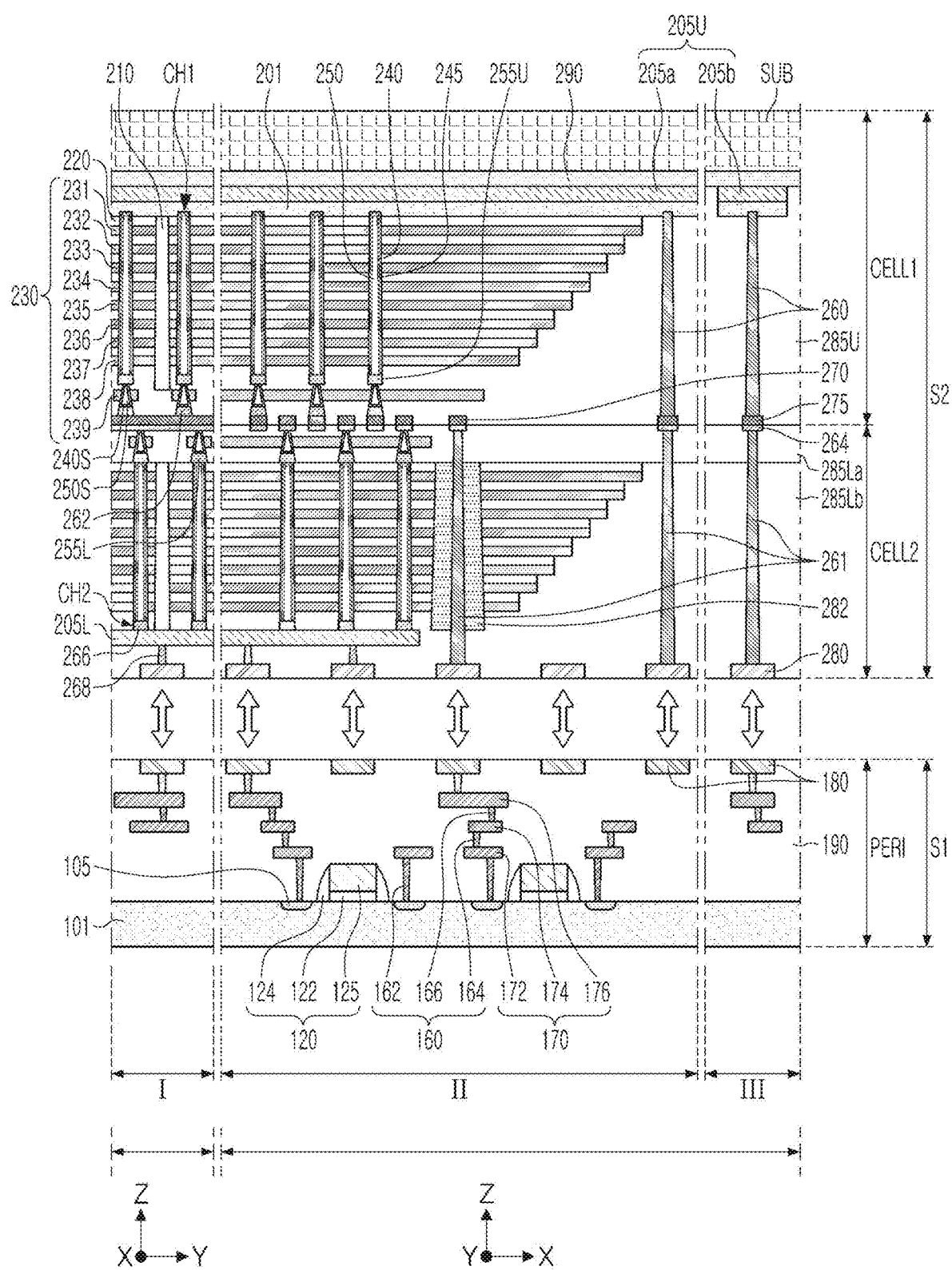

Referring to FIG. 10I, a second semiconductor structure S2 may be bonded to a first semiconductor structure S1.

The first semiconductor structure S1 may be prepared by forming circuit devices 120 and circuit wiring structures on a substrate 101.

A circuit gate dielectric layer 122 and a circuit gate electrode 125 may be formed on the substrate 101 in order. The circuit gate dielectric layer 122 and the circuit gate electrode 125 may be formed through an ALD process or a CVD process. The circuit gate dielectric layer 122 may be formed of silicon oxide, and the circuit gate electrode 125 may be formed of at least one of polycrystalline silicon and/or a metal silicide layer, but some other example embodiments are not limited thereto. A spacer layer 124 and source/drain regions 105 may be formed on both side walls of the circuit gate dielectric layer 122 and the circuit gate electrode 125. In some example embodiments, the spacer layer 124 may be formed of a plurality of layers. The source/drain regions 105 may be formed by performing an ion implantation process, for example.

Circuit contact plugs 160 among the circuit wiring structures may be formed by forming a portion of a peripheral region insulating layer 190, partially removing the portion through an etching process, and filling a conductive material. For example, circuit wiring lines 170 may be formed by depositing a conductive material and patterning the conductive material.

The peripheral region insulating layer 190 may be formed of a plurality of insulating layers. The peripheral region insulating layer 190 may be partially formed during processes of forming the circuit wiring structures, and may be partially formed in an upper portion of a third circuit wiring line 176 such that the peripheral region insulating layer 190 may cover the circuit devices 120 and the circuit wiring structures.

A first semiconductor structure S1 and a second semiconductor structure S2 may be connected to each other by bonding first bonding pads 180 and second bonding pads 280 with each other by applying pressure. The second semiconductor structure S2 may be bonded to the first semiconductor structure S1 upside down such that the second bonding pads 280 may face a lower portion. In the example embodiment illustrated in FIG. 10I, the second semiconductor structure S2 may be bonded in a form of a mirror image of the structure illustrated in FIG. 10H. The first semiconductor structure S1 and the second semiconductor structure S2 may be directly bonded with each other without using an adhesive such as an adhesive layer. For example, the first bonding pads 180 and the second bonding pads 280 may be bonded with each other on an atomic level through the process of applying pressure described above. In some example embodiments, to enhance adhesive force, a surface treatment process such as a hydrogen plasma treatment, for example, may also be performed onto an upper surface of the first semiconductor structure S1 and a lower surface of the second semiconductor structure S2 before the bonding process.

In some example embodiments, in the case in which a lower cell region insulating layer 285Lb includes the bonding dielectric layer described above in a lower portion, and the first semiconductor structure S1 has the same layer, adhesive force may further be secured by the dielectric bonding between the bonding dielectric layers as well as the bonding between the first and second bonding pads 180 and 280.

Figure 10J:
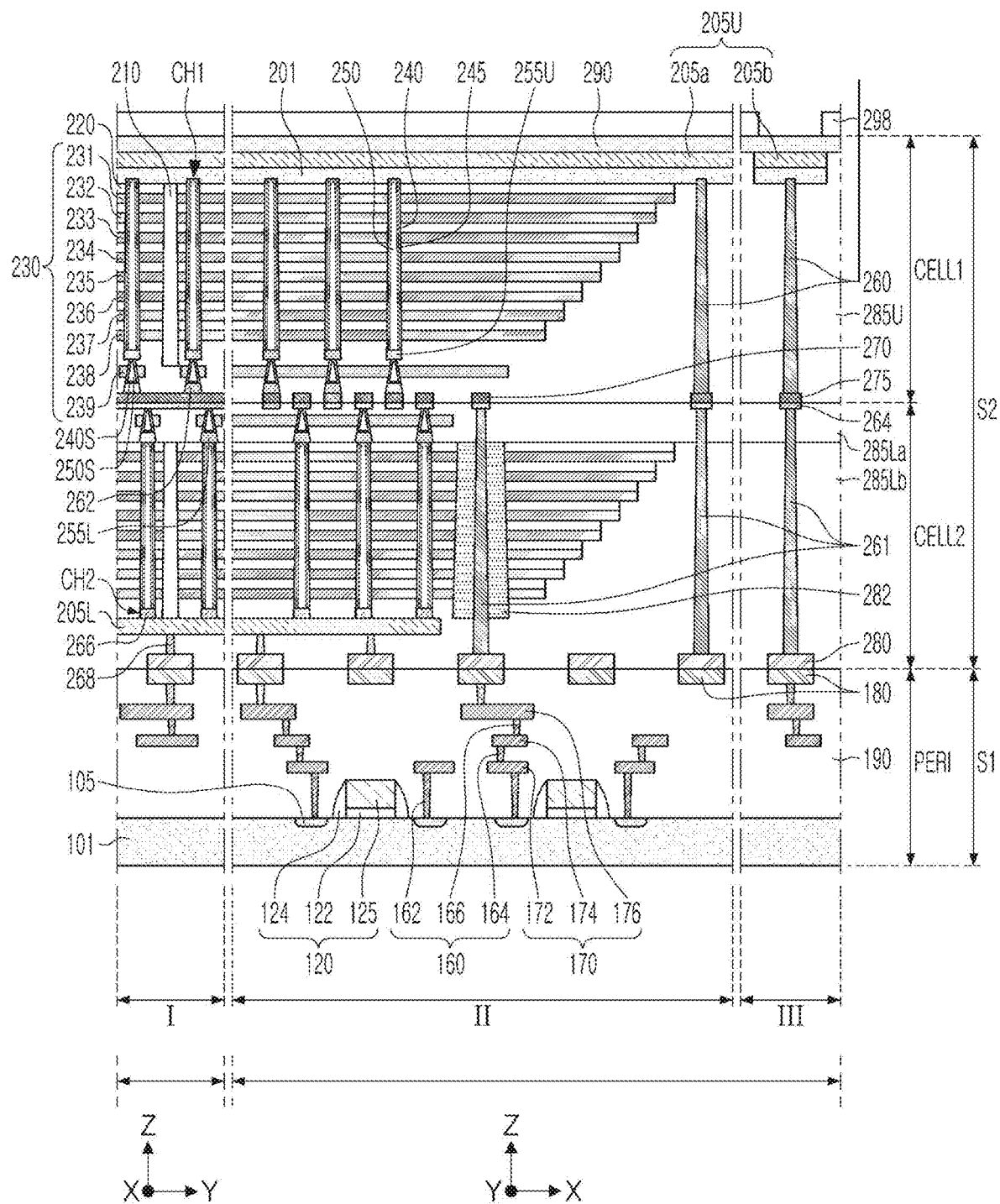

Referring to FIG. 10J, on a bonding structure of the first and second semiconductor structures S1 and S2, a base substrate SUB of a second semiconductor structure S2 may be removed, and a mask layer 298 for patterning a pad insulating layer 290 may be formed.

By removing the base substrate SUB, a thickness of a semiconductor device may be significantly reduced, and a process of forming a structure for wiring, such as a through via, may be omitted. A portion of the base substrate SUB may be removed through a polishing process such as a grinding process, and the other portion may be removed through an etching process such as a wet etching process, for example. Accordingly, the pad insulating layer 290 may be exposed to an upper portion. In the wet etching process, the pad insulating layer 290 may be used as an etch stop layer. Thus, the pad insulating layer 290 may include a material different from a material of the base substrate SUB, and may be formed of a material having etch selectivity under certain etching conditions. By removing the base substrate SUB of the second semiconductor structure S2, an overall thickness of a semiconductor device may be significantly reduced.

A mask layer 298 may be patterned to expose the pad region PAD illustrated in FIGS. 4 and 10J through a photolithography process. The mask layer 298 may be a photosensitive resin layer, for example.

Referring to FIG. 4 as well, an opening may be formed as illustrated in FIG. 4 by removing the pad insulating layer 290 exposed from the mask layer 298. Accordingly, a second conductive layer 205b in a lower portion may be exposed to an upper portion in the pad region PAD. When the pad insulating layer 290 is removed, the second conductive layer 205b may be used as an etch stop layer such that an etching process may easily be performed, and the semiconductor device 100 illustrated in FIG. 4 may be manufactured.

Figure 11:
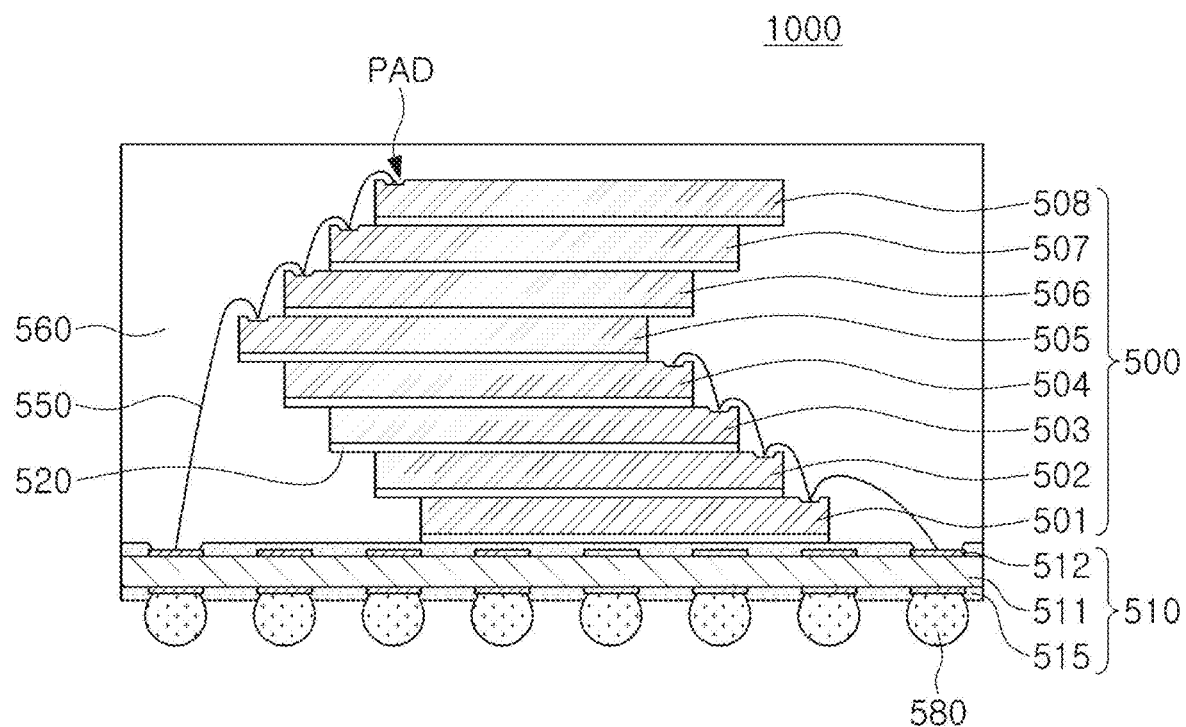
FIG. 11 is a schematic cross-sectional diagram illustrating a semiconductor package according to some example embodiments of the present inventive concepts.

FIG. 11 is a schematic cross-sectional diagram illustrating a semiconductor device according to some example embodiments.

Referring to FIG. 11, a semiconductor package 1000 may include a package substrate 510, memory chips 500 (e.g., memory chips 501 to 508) stacked on the package substrate 510, an adhesive layer 520 attaching the memory chips 500, wires 550 connecting the memory chips 500 and the package substrate 510 to each other, an encapsulating portion 560 encapsulating the memory chips 500, and connection terminals 580 disposed on a lower surface of the package substrate 510.

The package substrate 510 may include a body portion 511, conductive substrate pads 512 disposed on upper and lower surfaces of the body portion 511, and an insulating passivation layer 515 covering the substrate pads 512. The body portion 511 may include silicon (Si), glass, ceramic, or plastic. The body portion 511 may have a single layer, or may have a multilayer structure including wiring patterns therein.

The memory chips 500 may be stacked on the package substrate 510 and on lower memory chips 500 using the adhesive layer 520. The memory chips 500 may include the semiconductor devices 100, 100a, 100b, 100c, and/or 100d described with reference to FIGS. 4 to 9. The memory chips 500 may include the same type of memory chips, or may include different types of memory chips. In the case in which the memory chips 500 includes different types of memory chips, the memory chips 500 may include a DRAM, an SRAM, a PRAM, an ReRAM, an FeRAM, and/or an MRAM, in addition to the semiconductor devices 100, 100a, 100b, 100c, and 100d. The memory chips 500 may have the same size or different sizes, and the number of the memory chips 500 is not limited to the example illustrated in FIG. 11. A pad region PAD may be disposed on upper surfaces of the memory chips 500, and the pad region PAD may be disposed adjacent to (or near) edges of the memory chips 500, but some other example embodiments thereof are not limited thereto. For example, when a signal transfer medium corresponding to the wires 550 is formed using a three-dimensional (3D) printing process, the pad regions PAD may not be disposed in the edges. The memory chips 500 may be offset and stacked sequentially such that the pad region PAD may be exposed.

The wires 550 may electrically connect the memory chips 500 in an upper portion and the memory chips 500 in a lower portion, and/or may electrically connect at least portions of the memory chips 500 to the substrate pads 512 on the package substrate 510. The wires 550 may be an example of a signal transfer structure, and thus, depending on example embodiments, the wires 550 may be implemented as various forms of signal transfer mediums.

The encapsulating portion 560 may be disposed to cover the memory chips 500, the wires 550, and an upper surface of the package substrate 510 such that the encapsulating portion 560 may protect the memory chips 500. The encapsulating portion 560 may be formed of a silicone material, a thermosetting material, a thermoplastic material, a UV treatment material, and the like. The encapsulating portion 560 may be formed of a polymer such as a resin, for example. For example, the encapsulating portion 560 may be formed of an epoxy molding compound.

The connection terminals 580 may connect the semiconductor package 1000 to a main board of an electronic device on which the semiconductor package 1000 is mounted. The connection terminals 580 may include a conductive material, such as, at least one of solder, tin (Sn), silver (Ag), copper (Cu), and/or aluminum (Al), for example. In some example embodiments, the connection terminals 580 may be implemented by various forms such as lands, balls, pins, and the like.

Figure 12:
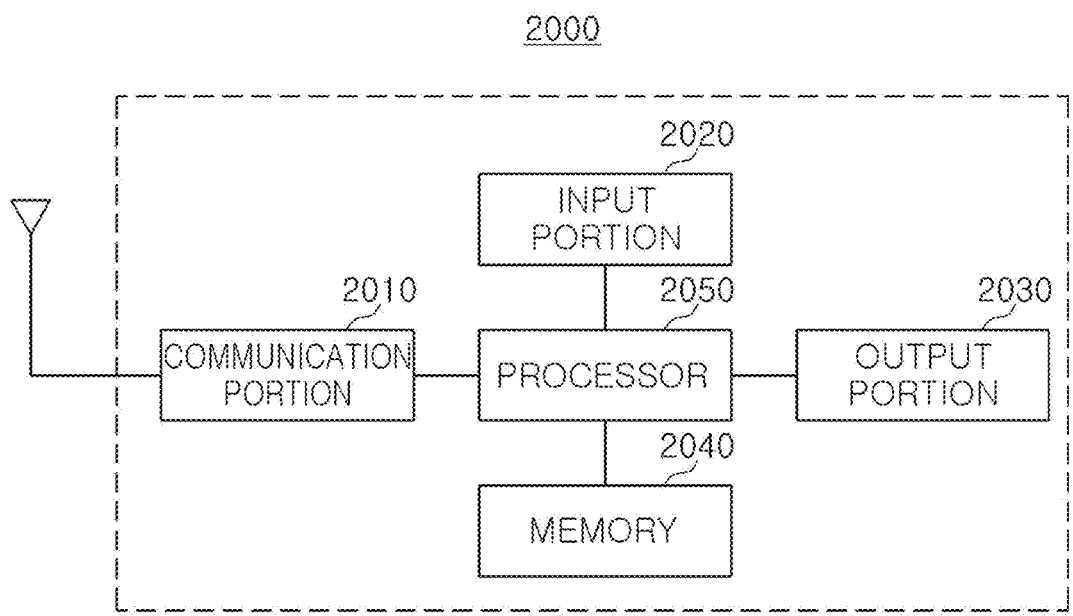
FIG. 12 is a block diagram illustrating an electronic device including a semiconductor device according to some example embodiments of the present inventive concepts.

FIG. 12 is a block diagram illustrating an electronic device including a semiconductor device according to some example embodiments.

Referring to FIG. 12, an electronic device 2000 may include a communication portion 2010, an input portion 2020, an output portion 2030, a memory 2040, and a processor 2050.

The communication portion 2010 may include a wired/wireless communication module, and may include a wireless interne module, a near field communication module, a GPS module, a mobile communication module, and the like. The wired/wireless communication module included in the communication portion 2010 may be connected to an external communication network based on various communication standards and may transmit and/or receive data. The input portion 2020 may be a module provided for a user to control operations of the electronic device 2000. The input portion 2020 may include a mechanical switch, a touch screen, a voice recognition module, and the like, and may further include a variety of sensor modules to which a user may input data. The output portion 2030 may output information processed in the electronic device 2000 in a form of voice or image, and the memory 2040 may store a program for processing or control of the processor 2050 and/or may store data, and the like. The memory 2040 may include one or more semiconductor devices described in the aforementioned example embodiments, described with reference to FIGS. 4 and 9, and may be embedded in the electronic device 2000 or may communicate with the processor 2050 through an interface. The processor 2050 may control operations of the components included in the electronic device 2000. The processor 2050 may perform a control or a processing related to voice call, video call, data communication, and the like, or may perform a control and a processing for reproduction and management of multimedia information. The processor 2050 may also process an input transferred from a user via the input portion 2020 and may output the result via the output portion 2030, and/or may store data required for controlling an operation of the electronic device 2000 in the memory 2040 and/or may withdraw the data from the memory 2040.

According to the aforementioned example embodiments, in a structure in which two or more semiconductor structures are bonded with each other, by disposing an input and output pad using a source conductive layer, a semiconductor device having improved integration density and reliability may be provided.

While some example embodiments have been shown and described above, it will be apparent to those skilled in the art that modifications and variations could be made without departing from the scope of the present inventive concepts as defined by the appended claims.

What is claimed is:

1. A semiconductor device, comprising:
   a first semiconductor structure including a substrate, circuit devices disposed on the substrate, and first bonding pads disposed on the circuit devices; and
   a second semiconductor structure connected to the first semiconductor structure, the second semiconductor structure including,
   a base layer having a first surface facing the first semiconductor structure and a second surface opposing the first surface;
   a first memory cell structure including first gate electrodes spaced apart from each other and stacked in a direction perpendicular to the first surface of the base layer, and first channels penetrating through at least portions of the first gate electrodes;
   a second memory cell structure including second gate electrodes spaced apart from each other and stacked in the direction perpendicular to the first surface, and second channels penetrating through at least portions of the second gate electrodes;
   bit lines disposed between the first memory cell structure and the second memory cell structure, and electrically connected to the first and second channels in common;
   first and second conductive layers spaced apart from each other and disposed on the second surface of the base layer;
   a pad insulating layer disposed on the first and second conductive layers and having an opening exposing a portion of the second conductive layer; and
   second bonding pads disposed to correspond to the first bonding pads in a lower portion of the second memory cell structure.

2. The semiconductor device of claim 1, further comprising:
a connection pad disposed in parallel to the bit lines and electrically connected to the second conductive layer.

3. The semiconductor device of claim 2, further comprising:
a first contact plug disposed between the second conductive layer and the connection pad and electrically connecting the second conductive layer and the connection pad.

4. The semiconductor device of claim 3, wherein the first contact plug includes a plurality of contact plugs, and the plurality of contact plugs are connected to the second conductive layer.

5. The semiconductor device of claim 3, wherein the first contact plug is directly connected to the second conductive layer by penetrating through the base layer.

6. The semiconductor device of claim 2, further comprising:
a second contact plug disposed between the connection pad and the second bonding pads and electrically connecting at least one of the second bonding pads to the connection pad.

7. The semiconductor device of claim 2, wherein the connection pad has a thickness substantially the same as a thickness of the bit lines.

8. The semiconductor device of claim 1, wherein the first conductive layer overlaps the first and second gate electrodes, and the second conductive layer is spaced apart from the first and second gate electrodes in a horizontal direction so as not to overlap the first and second gate electrodes.

9. The semiconductor device of claim 1, wherein the first conductive layer is included in a source line applying an electrical signal to the first channels, and the second conductive layer is electrically isolated from the first conductive layer.

10. The semiconductor device of claim 1, wherein the first and second conductive layers are disposed on substantially the same level and have substantially the same thickness.

11. The semiconductor device of claim 1, wherein side surfaces of the pad insulating layer defining the opening and an upper surface of the second conductive layer exposed by the opening are exposed externally of the semiconductor device.

12. The semiconductor device of claim 1, wherein the first and second channels have inclined side surfaces such that widths of the first and second channels decrease in a direction towards the base layer.

13. The semiconductor device of claim 1, further comprising:
a third conductive layer disposed in a lower portion of the second memory cell structure and included in a source line applying an electrical signal to the second channels.

14. A semiconductor device, comprising:
a first semiconductor structure including a substrate, circuit devices disposed on the substrate, and first bonding pads disposed on the circuit devices; and
a second semiconductor structure connected to the first semiconductor structure on the first semiconductor structure, the second semiconductor structure including,
a base layer;
memory cell structures stacked in a direction perpendicular to a lower surface of the base layer;
at least one wiring line disposed between the memory cell structures and shared between the memory cell structures disposed upwardly and downwardly;
first and second conductive layers spaced apart from each other and disposed on an upper surface of the base layer;
a pad insulating layer disposed on the first and second conductive layers and having an opening exposing a portion of the second conductive layer;
a connection pad disposed in parallel to the at least one wiring line in a lower portion of the second conductive layer and electrically connected to the second conductive layer; and
second bonding pads disposed to correspond to the first bonding pads in lower portions of the memory cell structures.

15. The semiconductor device of claim 14, further comprising:
contact plugs disposed on an upper surface and a lower surface of the connection pad.

16. The semiconductor device of claim 15, wherein the second conductive layer is electrically connected to at least one of the second bonding pads through the connection pad and the contact plugs.

17. The semiconductor device of claim 14, wherein
the memory cell structures each include gate electrodes spaced apart from each other and stacked in a direction perpendicular to the lower surface of the base layer, and channels penetrating through the gate electrodes, and
the at least one wiring line includes bit lines electrically connected to the channels of the memory cell structures in common.

18. The semiconductor device of claim 17, wherein the at least one wiring line further includes a source line electrically connected to the channels of the memory cell structures in common.

19. A semiconductor device, comprising:
a first semiconductor structure including a substrate, circuit devices disposed on the substrate, and first bonding pads disposed on the circuit devices; and
a second semiconductor structure connected to the first semiconductor structure on the first semiconductor structure, the second semiconductor structure including,
a base layer;
memory cell structures stacked in a direction perpendicular to a lower surface of the base layer on the lower surface, and including gate electrodes stacked vertically;
at least one wiring line disposed between the memory cell structures and shared between the memory cell structures disposed upwardly and downwardly;
a first conductive layer disposed on the base layer in upper portions of the gate electrodes;
a second conductive layer spaced apart from the first conductive layer in a horizontal direction and provided for electrical connection with an external device;
a pad insulating layer disposed on the first and second conductive layers and having an opening exposing a portion of the second conductive layer;
a connection pad disposed in parallel to the at least one wiring line in a lower portion of the second conductive layer and electrically connected to the second conductive layer; and
second bonding pads disposed to correspond to the first bonding pads in lower portions of the memory cell structures.

20. The semiconductor device of claim 19, wherein the first conductive layer is a source line applying an electrical signal to the memory cell structures.

\* \* \* \* \*